(12) United States Patent
Harada et al.

(10) Patent No.: US 7,538,323 B2
(45) Date of Patent: May 26, 2009

(54) INTERFEROMETER

(75) Inventors: Ken Harada, Wako (JP); Tetsuya Akashi, Fujimi (JP); Yoshihiko Togawa, Wako (JP); Tsuyoshi Matsuda, Wako (JP); Noboru Moriya, Wako (JP)

(73) Assignee: Riken, Saitama (JP)

( * ) Notice: Subject to any disclaimer, the term of this patent is extended or adjusted under 35 U.S.C. 154(b) by 253 days.

(21) Appl. No.: 10/585,359

(22) PCT Filed: Jan. 7, 2005

(86) PCT No.: PCT/JP2005/000111

§ 371 (c)(1),
(2), (4) Date: Mar. 20, 2007

(87) PCT Pub. No.: WO2005/066998

PCT Pub. Date: Jul. 21, 2005

(65) Prior Publication Data

US 2007/0272861 A1    Nov. 29, 2007

(30) Foreign Application Priority Data

Jan. 9, 2004  (JP)  ............................. 2004-004156

(51) Int. Cl.
*G01B 15/00* (2006.01)
(52) U.S. Cl. ........................ 250/310; 250/306; 250/307; 250/311
(58) Field of Classification Search ................. 250/306, 250/307, 309, 310, 311; 356/28.5
See application file for complete search history.

(56) References Cited

U.S. PATENT DOCUMENTS 5,466,548 A * 11/1995 Matsui .......................... 430/1

FOREIGN PATENT DOCUMENTS

| JP | 1-264151 | 10/1989 |
|----|----------|---------|
| JP | 1-264151 A | 10/1989 |
| JP | 10-199464 | 7/1998 |
| JP | 10-199464 A | 7/1998 |
| JP | 2004-171922 | 6/2004 |
| JP | 2004-171922 A | 6/2004 |
| WO | 01/75394 | 10/2001 |

OTHER PUBLICATIONS

International SearchReport for PCT/JP2005/000111 dated Apr. 19, 2005 (English and Japanese).

(Continued)

*Primary Examiner*—Michael Maskell
(74) *Attorney, Agent, or Firm*—Nixon & Vanderhye, P.C.

(57) ABSTRACT

The present invention provides a technique enabling to control fringe spacing s and an interference width W independently of each other, which are important parameters for an interferometer using an electron biprism.

In the present invention, two electron biprisms $9u$, $9b$ are used in two stages along the optical axis, and fringe spacing s and an interference width W are controlled independently of each other by controlling a voltage applied to an electrode of each of the electron biprisms. Also Fresnel diffraction can be suppressed.

16 Claims, 17 Drawing Sheets

OTHER PUBLICATIONS

Ru et al., *Electron holography available in a non-biprism transmission electron microscopy,* Ultramicroscopy 53, 1 (1994), pp. 1-7.

Harada et al., *Profile structure of magnetic flux lines in type-II superconductor from a rectangular electron hologram,* Journal of Electron Microscopy, 52 (4), 2003, pp. 369-373.

Harada et al., *A New FET Method for Numerical Reconstruction in Electron Holography,* Journal of Electron Microscopy, 40, 1991, pp. 92-96.

Zernike, *The Construction of Degree of Coherence and Its Application to Optical Problems,* Physica V, No. 8, Aug. 1938, pp. 785-795.

Thompson et al., *Two-Beam Interference with Partially Coherent Light,* Journal of the Optical Society of America, vol. 47, No. 10, Oct. 1957, pp. 895-902.

Speidel et al., *Richtstrahlwertmessungen an einem Strahlerzeugungssystem mit Feldemissionskathode,* Optik 49, No. 2, 1977, pp. 173-185.

Harada et al., *Optical Simulation for Electron Holography,* Technology Reports of the Osaka University, vol. 39, No. 1960 (Oct. 1989), pp. 117-128.

\* cited by examiner $V_{F1}$ = -20V
$V_{F2}$ = 190 V 0.2 μm $V_{F1}$ = 50 V
$V_{F2}$ = 190 V 0.2 μm 0.2 μm $V_{F1}$ = -200 V
$V_{F2}$ = -190 V 0.2 μm $V_{F1}$ = -250 V
$V_{F2}$ = -190 V 0.2 μm 0.2 μm

INTERFEROMETER

This application is the US national phase of international application PCT/JP2005/000111 filed 7 Jan. 2005, which designated the U.S. and claims priority to JP 2004-004156 filed 9 Jan. 2004, the entire content of each of which is hereby incorporated by reference.

TECHNICAL FIELD

The present invention relates to a phase-splitting type electron interferometer having an electron biprism and a phase-splitting type optical interferometer having an optical biprism.

BACKGROUND OF THE INVENTION

Optical interferometers are largely classified into those based on an amplitude-splitting method and those based on a phase-splitting method. Excluding specific cases, an optical interferometer (such as that based on a laser) generally employs an amplitude-splitting method. This is because a phase distortion caused by an optical system can be compensated and thereby it becomes relatively easy to accurately detect a minute phase distribution which is an object to be observed. On the other hand, an electron interferometer generally employs the phase-splitting method except in the cases described in Non-patent document 1 (Q. Ru et al.: Ultramicroscopy 53, 1 (1994)). This is because there is no effective amplitude-splitting type beam splitter for an electron beam.

As an electron interferometer, only a phase-splitting type interferometer having one electron biprism has been used. However, this type of interferometer cannot control each of a fringe spacing s and an interference width W independently because of its operational principles. For instance, when a specimen is large and a wide interference width is necessary, it is necessary to analyze an interference image (hologram) formed with small fringe spacing and many interference fringes, in other words, an image recorded with a high carrier-spatial frequency. On the contrary, even if a specimen is small and an interference image obtained in a narrow area with a high carrier-spatial frequency is required for analysis, when a necessary high carrier-spatial frequency is produced, the interference width becomes larger with the spatial coherence deteriorated. As a result, a (low-quality) interference image having the low-contrast interference fringes needs to be analyzed.

To solve the problems as described above, some electron optical systems have been developed or re-configured based on various researches and experiments. Due to some characteristics (for example, an optical system with only several convex lenses, and an optical system without a half mirror) of electron optical systems, however, there are limitations such as a limitation where the magnification finally obtained is low.

In addition, when a hologram is reconstructed and a phase image is extracted, the Fresnel diffraction waves caused by a breakage at the wavefront generate fringes with strong contrast (Fresnel fringes), which generates artifact in the result of the measurement and impedes high precision phase measurement. When an object to be observed is a weak phase object, some methods have been proposed such as a method in which the effects of phase distribution due to Fresnel fringes are corrected later (Refer to, for instance, Non-patent document 2: K. Harada et al.: J. Electron Microsc. 52, 369 (2003)), a method in which the effects are eliminated in the Fourier space upon regeneration, a method in which the effects are subtracted as strength from two holograms (Refer to, for instance, Non-patent document 3: K. harada and R. Shimize: J Electron Microsc. 40, 92, (1991)), and a method in which phase components of Fresnel fringes are extracted and subtracted, (Patent document 1: International publication No. 01/075394, pamphlet). In all of these methods, however, the effects of Fresnel fringes are removed after data is recorded. These methods are not sufficient. As a result, a practical method is to neglect the end of interference range where Fresnel fringes have strong contrast, even if an interference range is sacrificed. On the other hand, ideas of suppressing formation of Fresnel fringes are proposed, for instance, in Patent document 1 (International publication No. 01/075394, pamphlet). According to the document, to eliminate Fresnel fringes generation from a wavefront-splitting boundary, a beam stopper plate is placed on a plane equivalent to the observation plane so that the wavefront-splitting boundary of a wavefront-splitting device is placed in the shadow of the observation plane. Thereby, it is possible to have a case where Fresnel diffraction does not occur. This method, however, would not provide any improvement of the primary problem that each of fringe spacing s and interference width W cannot be controlled independently.

Patent Document 1: International publication 01/075394
Non-patent Document 1: Q. Ru et al.: Ultramicroscopy 53, 1 (1994)
Non-patent Document 2: K. Harada et al.: J. Electron Microsc. 52, 369 (2003)
Non-patent Document 3: K. Harada and R. Shimizu: J. Electron Microsc. 40, 92 (1991)

SUMMARY OF THE INVENTION

An object of the present invention is to provide an electron interferometer or a phase-splitting type optical interferometer having a general optical biprism, each capable of controlling fringe spacing s and interference width W independently.

To solve the problems described above, the present invention provides an apparatus having two (an upper and a lower) biprisms placed sequentially along an optical axis, or in the direction in which light or an electron beam travels. The upper (in the upstream side in the direction of an electron beam or traveling light) biprism, including a beam stopper section to shield the electron beam or light, is placed on an image plane of a specimen to be observed. A phase-splitting boundary of the lower biprism is placed in a shadow produced by the beam stopper section. By selecting a deflection angle of each biprism, it is possible to freely change an overlapping area and an overlap angle of two electrons or two lights. By adapting the position of the beam stopper section of the upper biprism to the image plane, it becomes possible to eliminate Fresnel fringe generation which has been a problem in the conventional technology and to control the fringe spacing s and an overlapping area (interference width W) having the fringes with the fringe spacing s independently.

To describe the electron interferometer in further details, an electrode of the upper electron biprism is placed on an image plane of a specimen to be observed, and an electrode of the lower electron biprism is placed in the shadow produced by the electrode of the upper electron biprism. By changing potentials applied to each electrode, the overlapping area and the overlap angle can be freely changed.

Effects of the Invention

According to the present invention, each of two parameters of a fringe spacing s and an interference width W in interferometry using a biprism can be controlled independently. With this feature, it is possible to independently treat spatial coherence and a carrier-spatial frequency, each directly relating to the performance of an interferometer. As a result, the range of an object to be observed with holography can be increased. Especially, in an electron interferometer, the two parameters of a fringe spacing s and an interference width W can freely and independently be controlled only by controlling voltages to each of upper and lower electron biprisms.

DESCRIPTION OF SYMBOLS

Figure 1A:
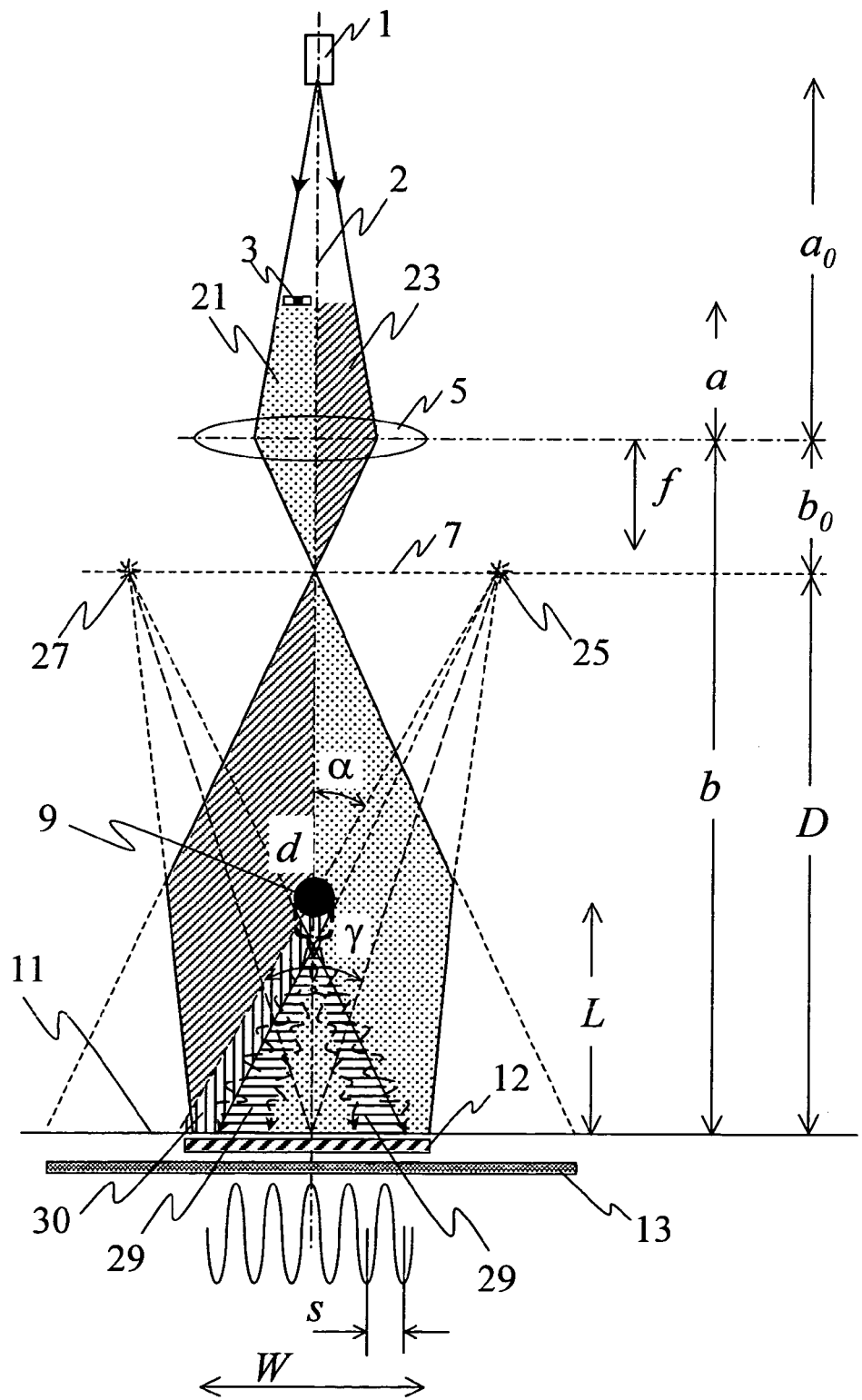
FIG. 1A is a diagram illustrating an optical interferometer system using a conventional type of electron biprisms.

1: Electron source
2: Optical axis
3: Specimen
5: Objective lens
7: Image plane of electron source
9: Electrode of electron biprism
$9_u$: Electrode of upper stage electron biprism
$9_b$: Electrode of lower stage electron biprism
11: Observation plane
12: Image of specimen
13: Image recording medium such as film or camera
21: Object wave
23: Reference wave
25, 27: Virtual electron source position on second electron source plane 35 (Virtual image of electron source)
26, 28: Real electron source image on second electron source plane 35
30: Shadow of the electrode 9 of electron biprism
31: First image plane
32: Specimen image on first image plane 31
33: Magnifying lens
35: Second image plane of electron source
29: Fresnel diffraction wave
a: Distance between objective lens 5 and specimen 3
$a_o$: Distance between objective lens 5 and electron source 1
$a_1$: Distance between objective lens 5 and electron source 1
$a_2$: Distance between first image plane 7 and magnifying lens 33
$a_b$: Distance between first image plane 31 and magnifying lens 33
$a_u$: Distance between objective lens 5 and specimen 3
$b_1$: Distance between objective lens 5 and first electron source image plane 7
$b_2$: Distance between magnifying lens 33 and second electron source image plane 35
$b_b$: Distance between magnifying lens 33 and observation plane 11

$b_u$: Distance between first image plane 31 and object lens 5
f: Focal length of objective lens 5
$f_1$: Focal length of objective lens 5
$f_2$: Focal length of magnifying lens 33
λ: Wavelength of electron beam from electron source 1
γ: Angle between two virtual electron sources on specimen plane
α: Deflection angle of electron beam by electrode 9 of electron biprism
$α_u$: Deflection angle of electron beam by electrode 9 of upper stage electron biprism
$α_b$: Deflection angle of electron beam by electrode $9_b$ Of lower stage electron biprism
$L_B$: Distance between electrode $9_b$ of lower stage electron biprism
$M_b$: Magnification of magnifying lens 33
$M_u$: Magnification of objective lens 5
$D_u$: Distance between first image plane of electron source 7 and observation plane 31
$D_b$: Distance between second image plane of electron source 35 and observation plane 11
d: Diameter of electrode 9 of electron biprism
$d_u$: Diameter of electrode $9_u$ of upper stage electron biprism
$d_b$: Diameter of electrode $9_b$ of lower stage electron biprism
51, 53: Optical biprism
52: Beam stopper
61: Real electron source
63: First condenser lens
65: Second condenser lens
67: First intermediate lens
68: Second image plane
69: Second intermediate lens
71: Third intermediate lens
73: Projection lens
81: Specimen on third image plane
83: Third image plane of electron source

DESCRIPTION OF THE PREFERRED EMBODIMENTS

The present invention is applicable to an electron interferometer and a phase-split type optical interferometer having a general optical biprism. In an embodiment of the present invention described below, however, an electron interferometer is mainly described, and a phase-splitting type optical interferometer having a general optical biprism is described in general in the final section of this specification.

FIG. 1A is a view illustrating an interference system using an electron beam biprism based on the conventional technology. An electron biprism is a device which is used most popularly as an optical system for electron holography. Reference wave 23 are overlaid on object wave 21 in the optical system. As a result, an interferogram in which interference fringes are superposed on an enlarged image of a specimen is obtained. As well known, the electron biprism has a filament electrode provided at a central portion thereof and double-plates electrodes holding the filament electrode inbetween. The double-plates are grounded and deflect an electron beam passing through the electron biprism by controlling a potential in the electrode provided at the central portion. In this specification, an electrode of an electron biprism means a filament electrode provided at the central portion, and grounded double-plates electrodes are not described.

In FIG. 1A, reference numeral 1 denotes an electron source. Reference numeral 2 denotes an optical axis. Reference numeral 3 denotes a specimen. Reference numeral 5 denotes an object lens. Reference numeral 7 denotes an image plane of electron source. Reference numeral 9 denotes an electron biprism electrode. Reference numeral 11 denotes an observation plane. Reference numeral 12 denotes an image of a specimen. Reference numeral 13 denotes a recording media such as a film or a camera. The electron source 1 is shown as a single block in the figure. However, the electron source 1 includes a electron source, an acceleration tube, and a condenser lens system. An electron beam generated in the electron source 1 is divided into an object wave 21 passing through the specimen 3 placed in one side of the optical axis 2 and a reference wave 23 passing through the side where the specimen 3 is not present. The objective wave 21 and the reference wave 23 are refracted by the object lens 5, cross each other on the image plane of the electron source 7, and travel toward the observation plane 11. Furthermore, the object wave 21 and the reference wave 23 are deflected by the electrode of the electron biprism 9 provided between the image plane of electron source 7 and the observation plane 11, and are superposed on the observation plane 11. As a result, an interferogram in which the interference fringes are superposed on a magnified image of the specimen on the observation plane 11. The interferogram obtained on the observation plane 11 is supplied by a recording media 13 to a user. FIG. 1A schematically shows the fringe spacing s and the interference width W appearing on the observation plane 11. Reference numerals 25 and 27 are virtual electron source positions for the object wave 21 and the reference wave 23 deflected by the electron biprism electrode 9. Reference numeral 30 denotes a shadow generated by the electron biprism electrode 9, and only a shadow generated in the left side from the optical axis 2 is shown for simplicity in the figure. The specimen is placed by a specimen holder on the upstream side of the objective lens 5. The specimen holder, however, is not shown in the figure.

The fringe spacing s and the interference width W are expressed by equations (1) and (2) below respectively:

$$s = \frac{\lambda}{\gamma} \quad (1)$$
$$= \frac{(b-b_0)\lambda}{2\alpha(b-b_0-L)}$$
$$= \frac{D\lambda}{2\alpha(D-L)}$$

$$W = 2\alpha L - \frac{b-b_0}{b-b_0-L}d \quad (2)$$
$$= \frac{2\alpha}{\lambda}\left\{\frac{2\alpha L(b-b_0-L)}{b-b_0} - d\right\} \cdot s$$
$$= 2\alpha L - \frac{2\alpha}{\gamma}d$$

wherein λ denotes a wavelength of an electron beam from the electron source 1, γ denotes an angle formed by electron beams from the virtual electron sources 25 and 27 positioned in both sides of the optical axis 2, α denotes a deflection angle (rad) of an electron beam by the electron biprism, d denotes a diameter of the electron biprism electrode 9, L denotes a distance between the electron biprism electrode 9 and the observation plane 11, b denotes a distance between the objective lens 5 and the observation plane 11, $b_0$ denotes a distance between the object lens 5 and the image plane of the electron source 7, and D denotes a distance between the observation surface 11 and the image plane of the electron source 7.

The deflection angle α (rad) of an electron beam is expressed by the equation of $\alpha = k \cdot V_f$ wherein $V_f$ indicates a voltage (V) applied to the electron biprism electrode 9. k denotes a deflection constant k.

Practically, a hologram which a user requires must be recorded for a specimen, and therefore the equations (1), (2) above are applied to a specimen plane, and the fringe spacing $s_{Obj}$ and the interference width $W_{Obj}$ are obtained through the following equations (3), (4) respectively:

$$s_{Obj} = \frac{a(b-b_0)\lambda}{2\alpha b(b-b_0-L)} \tag{3}$$

$$W_{Obj} = \frac{2\alpha aL}{b} - \frac{a(b-b_0)}{b(b-b_0-L)}d = \frac{2\alpha}{\lambda}\left\{\frac{2\alpha L(b-b_0-L)}{b-b_0} - d\right\} \cdot s_{Obj} \tag{4}$$

wherein a denotes a distance between the objective lens 5 and the specimen 3. Although not shown in each of the equations above, $a_o$ denotes a distance between the objective lens 5 and the electron source 1, and f denotes a focal length of the objective lens 5. In deriving the equations above, a formula (5) for a lens is applied to the electron source and the specimen.

$$\left.\begin{array}{l}\dfrac{1}{f} = \dfrac{1}{a_0} + \dfrac{1}{b_0} \\ \dfrac{1}{f} = \dfrac{1}{a} + \dfrac{1}{b}\end{array}\right\} \tag{5}$$

As well understood from comparison of equation (1) to equation (2) or of equation (3) to equation (4), both of the fringe spacing s and the interference width W are affected by the deflection angle α of an electron beam, and therefore each of the factors cannot be controlled independently.

Figure 1B:
FIG. 1B illustrates a state where Fresnel fringes generated by an electrode of the electron biprism are superposed on interference fringes actually obtained.
Figure 1B:
Figure 1C:
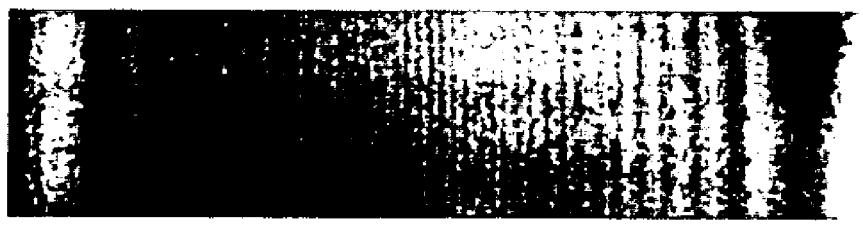
FIG. 1C illustrates a state in which artifact phase distribution are present in a reconstructed phase image.

Furthermore, the Fresnel fringe from the electron biprism electrode 9 is superposed on the interference fringe actually obtained as shown in FIG. 1B. A phase distribution of artifacts is generated in the reconstructed phase image as shown in FIG. 1C. To describe the phenomenon with reference to FIG. 1A, an interference fringe is generated by interference between the object wave 21 and the reference wave 23, each defected by the electron biprism electrode 9 on the observation plane 11. However, since the electron biprism electrode 9 is present, the Fresnel diffraction wave 29 is generated at an edge face of the electron biprism electrode 9, and the Fresnel fringes are generated on the observation plane 11.

Non-patent documents 2, 3 described in relation to the background technology propose measures for eliminating influences of a phase distribution caused by the Fresnel fringes by detecting and recording the phase distribution caused by Fresnel fringes by any means and reducing the influences from the obtained reconstructed image based on the data. However, the Fresnel fringes change depending on a voltage applied to the electron biprism electrode 9 (a deflection angle of an electron beam from the electron beam biprism electrode 9). Thus, countermeasures are required for various experimental conditions, i.e., required each time the applied voltage is changed, and are not practical. Furthermore, in a specimen in the case where a phase largely changes, since the recorded Fresnel fringes are subjected to phase modulation, the influence due to the phase distribution caused by the Fresnel fringes cannot easily be removed by the simple subtraction method (on the contrary, new artifacts may be generated in the method).

In other words, complete elimination of Fresnel fringe generation is principally most effective.

Basic Configuration of the Present Invention

Figure 2:
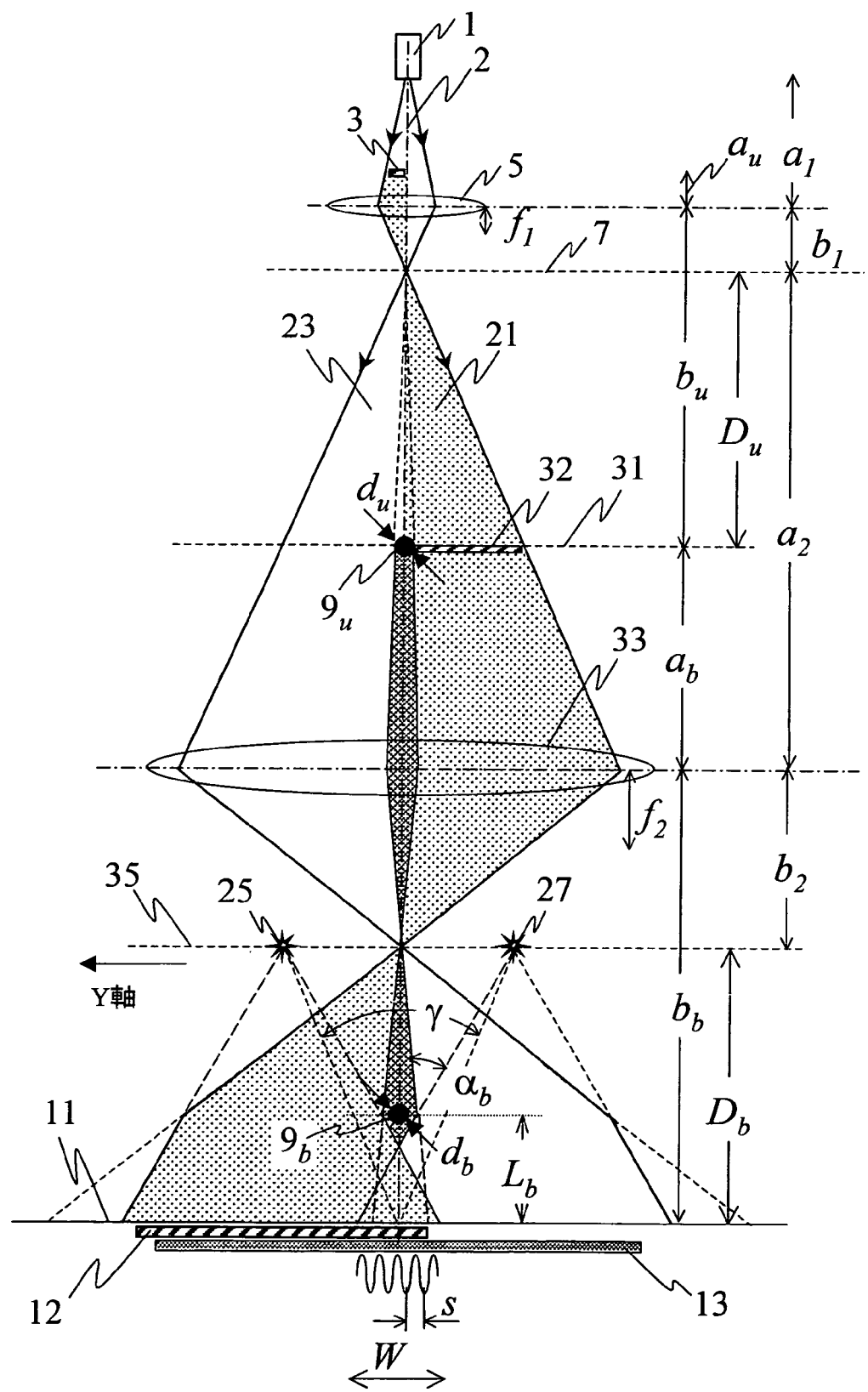
FIG. 2 is a diagram illustrating an optical system in an electron interferometer according to the present invention.

FIG. 2 is a view illustrating an embodiment of an optical system in which the present invention is applied to an electron interferometer. In the electron interferometer according to the present invention, electron biprisms are provided in the upper and lower stages along the optical axis. An electrode of the electron biprism in the upper stage is provided on an image plane (first image plane) of a specimen, and magnification and demagnification are performed together with the specimen image in the optical system in the lower stage. An electrode of the electron biprism in the lower stage functions as an ordinary interferometer.

In FIG. 2, reference numeral 1 denotes an electron source. Reference numeral 2 denotes an optical axis. Reference numeral 3 denotes a specimen. Reference numeral 5 an objective lens. Reference numeral 7 denotes a first image plane of the electron source. Reference numeral 31 denotes a first image plane. Reference numeral 32 denotes a specimen image on the first image plane 31. Reference numeral 33 denotes a magnifying lens. Reference numeral 35 denotes a second electron source image plane. Reference numeral 11 denotes an observation plane. Reference numeral 12 denotes an image of a specimen. Reference numeral 13 denotes a recording media such as a film or a camera. Reference numeral $9_u$ denotes an electrode of an upper stage electron biprism provided on the first image plane 31 with the diameter of $d_u$. Reference numeral $9_b$ denotes an electrode of a lower stage electron biprism provided between the second electron source image plane 35 and the observation plane 11 with a diameter of $d_b$. As shown in FIG. 2, the reference numerals 25 and 27 denote positions of virtual images of electron sources for the object wave 21 and the reference wave 23 deflected by the electron biprism electrode 9. The fringe spacing s and the interference width W of interference fringes appearing on the observation plane 11 are schematically shown under the recording media 13.

Also, like in the example of the conventional technology shown in FIG. 1A, an electron beam generated from the electron source 1 is divided into the object wave 21 passing through the specimen 3 placed in one side of the optical axis 2 and the reference wave 23 passing through the side where the specimen 3 is not present in FIG. 2. A pattern display is not appended to the reference wave 23. The object wave 21 and the reference wave 23 are refracted by the objective lens 5, cross each other on the first image plane of the electron source 7, and travel toward the magnifying lens 33. The object wave 21 and the reference wave 23 form a specimen image 32 on the first image plane 31, and pass through the electron biprism in the upper stage on the first image plane 31. However, the object wave 21 and the reference wave 23 are not deflected as shown in FIG. 2, and are refracted by the magnifying lens 33, and travel toward the observation plane 11. Then the object wave 21 and the reference wave 23 passes through the electron biprism in the lower stage provided between the second image plane of the electron source 35 and the observation plane 11, are deflected by the electron biprism, and are superposed on each other on the observation plane 11. The deflection angle in this step is $\alpha_b$. As a result, an interferogram, in which interference fringes are superposed on an enlarged image 12, is obtained on the observation plane 11. The interferogram obtained on the observation plane 11 is provided by the recording media 13 to a user.

For sizes of electrodes of the electron biprisms provided in the upper and lower stages, a magnification and a position of an electrode $9_b$ of the lower stage electron biprism should be selected so that the electrode $9_b$ is in the shadow of an electrode $9_u$ of the upper stage electron biprism. When the conditions are satisfied, an electron beam is not directly irradiated onto the electrode $9_b$ of the lower stage electron biprism. Thus, scattering of the electron beam does not occur, and substantially Fresnel fring is not generated. To describe more accurately, the electrode $9_u$ of the upper stage electron biprism generates Fresnel diffraction wave, and the wave spreads in the entire space. Thus, the diffraction wave secondarily generates Fresnel fringes at the electrode $9_b$ of the lower stage electron biprism. However, the intensity is very small and ignorable. The Fresnel diffraction wave itself generated by the electrode $9_u$ of the upper stage electron biprism converges as an image on the observation plane 11 since the electrode $9_u$ of the upper stage electron biprism is provided on the first image plane 31. As a result, any Fresnel fringe is not formed by either one of the electrodes of the upper and lower electron biprisms on the observation plane 11. Therefore, an interference fringe without Fresnel fringe superposed thereon can be obtained.

With respect to the embodiment of the optical system, the fringe spacing s and the interference width W calculated on a specimen plane can be expressed by the following equations (6) and (7):

$$s_{Obj} = \frac{a_b}{b_b} \cdot \frac{a_u}{b_u} \cdot \frac{(b_b - b_2)\lambda}{2\alpha_b(b_b - b_2 - L_b)} \quad (6)$$
$$= \frac{1}{M_b} \cdot \frac{1}{M_u} \cdot \frac{D_b \lambda}{2\alpha_b(D_b - L_b)}$$

$$W_{Obj} = \frac{a_b}{b_b} \cdot \frac{a_u}{b_u} \cdot 2\alpha_b L_b - \frac{a_u}{b_u} d_u \quad (7)$$
$$= \frac{1}{M_b} \cdot \frac{1}{M_u} \cdot 2\alpha_b L_b - \frac{1}{M_u} d_u$$

wherein $a_b$ denotes a distance between the first image plane 31 and the magnifying lens 33. $a_u$ denotes a distance between the objective lens 5 and the specimen 3. $b_b$ denotes a distance between the magnifying lens 33 and the observation plane 11. $b_u$ denotes a distance between the first image plane 31 and the objective lens 5. $b_2$ denotes a distance between the magnifying lens 33 and the second image plane of the electron source 35. $\lambda$ denotes a wavelength of an electron beam from the electron source 1. $\alpha_b$ denotes a deflection angle (rad) of an electron beam from the electrode $9_b$ of the lower stage electron biprism. $L_b$ denotes a distance between the electrode $9_b$ of the lower stage electron biprism and the observation plane 11. $M_b$ denotes a magnification of the specimen 3 by the magnifying lens 33. $M_u$ denotes a magnification of the specimen 3 by the objective lens 5. $D_b$ denotes a distance between the second image plane of the electron source 35 and the observation plane 11. $d_u$ denotes a diameter of the electrode $9_u$ of the upper stage electron biprism.

Although not shown in any of the equations above, $a_1$ denotes a distance between the objective lens 5 and the electron source 1. $b_1$ denotes a distance between the objective lens 5 and the first image plane of the electron source 7. $a_2$ denotes a distance between the first image plane of the electron source 7 and the magnifying/demagnifying lens 33. $D_u$ denotes a distance between the first image plane of the electron source 7 and the first image plane 31. $d_b$ denotes a diameter of the electrode $9_u$ of the lower stage electron biprism. $f_1$ denotes a focal length of the objective lens 5. $f_2$ denotes a focal length of the magnifying/demagnifying lens 33. To derive the equations above, the lens formula (8) to a electron source and a specimen is used.

$$\left.\begin{array}{l}\frac{1}{f_1} = \frac{1}{a_1} + \frac{1}{b_1} \\ \frac{1}{f_2} = \frac{1}{a_2} + \frac{1}{b_2} \\ \frac{1}{f_1} = \frac{1}{a_u} + \frac{1}{b_u} \\ \frac{1}{f_2} = \frac{1}{a_b} + \frac{1}{b_b}\end{array}\right\} \quad (8)$$

The conditions to be satisfied by the relation between the diameter $d_u$ and diameter $d_b$ are given by the equation (9) below:

$$d_b \leq \frac{b_b - b_2 - L_b}{b_b - b_2} \cdot \frac{b_b}{a_b} d_u = \frac{D_b - L_b}{D_b} \cdot M_b d_u \quad (9)$$

This is derived from the fact that the electrode $9_b$ of the lower stage electron biprism must be in the shadow of the electrode $9_u$ of the lower stage electron biprism. This relation is determined by the magnification of the optical system in the lower stage and the position of the electrode of the electron biprism in the optical system. Generally, the diameter of an electrode of an electron biprism is around 1 μm and little changes.

Form the view point of effectiveness in an optical system, it is described above in relation to FIG. 2 and Equation (9) that the electrode $9_b$ of the lower stage electron biprism is provided between the magnifying lens 33 and the observation plane 11. The same effect, however, can be provided as long as the electrode of the lower stage electron biprism is provided at any position within a shadow the electrode of the upper stage electron biprism (for instance, a position above the magnifying/demagnifying lens 33 shown in FIG. 8). Furthermore, if only the independent control over the fringe spacing s and the interference width W is required, without elimination of Fresnel fringe generation from the electrode $9_b$ of the lower stage electron biprism, the conditions expressed by the equation (9) and the like may not be satisfied.

Only the magnifying optical system is described above. However, the present invention may also be applied to a demagnifying optical system. When the present invention is applied to a demagnifying optical system, the terms of "magnifying and magnification" should be read as "demagnifying and demagnification". As shown in FIG. 2, although the electrode $9_u$ of the upper stage electron biprism and the electrode $9_b$ of the lower stage electron biprism are drawn, each with a posture vertical to the figure. An electron beam, however, runs from the electrode $9_u$ of the upper stage electron biprism to the electrode $9_b$ of the lower stage electron biprism via the magnifying lens 33, and is deflected (turned) by the magnifying/demagnifying lens 33. Thus, it is needless to say that relative displacement due to an angle corresponding to the deflection occurs. Furthermore, in the present invention, the electron biprism is accordingly provided at any position, and a voltage applied to an electrode of the electron biprism is controlled. However, since these techniques can easily be understood by those skilled in the art, the techniques are not illustrated.

Control over the fringe spacing and the interference width is described below.

EXAMPLE OF CONTROL 1

Interference fringes caused by the phase-splitting method are formed by two virtual sources. In other words, when the deflection angle $\alpha_b$ is produced by a voltage applied to the lower biprism electrode $9_b$, the source is deemed to be splitted two virtual sources 25, 27 placed from side to side relative to the Y-axis as illustrated in FIG. 2, and then interference fringes given by the equations (6) and (7) are generated in the area where wavefronts are superposed on the image plane.

EXAMPLE OF CONTROL 2

Figure 3:
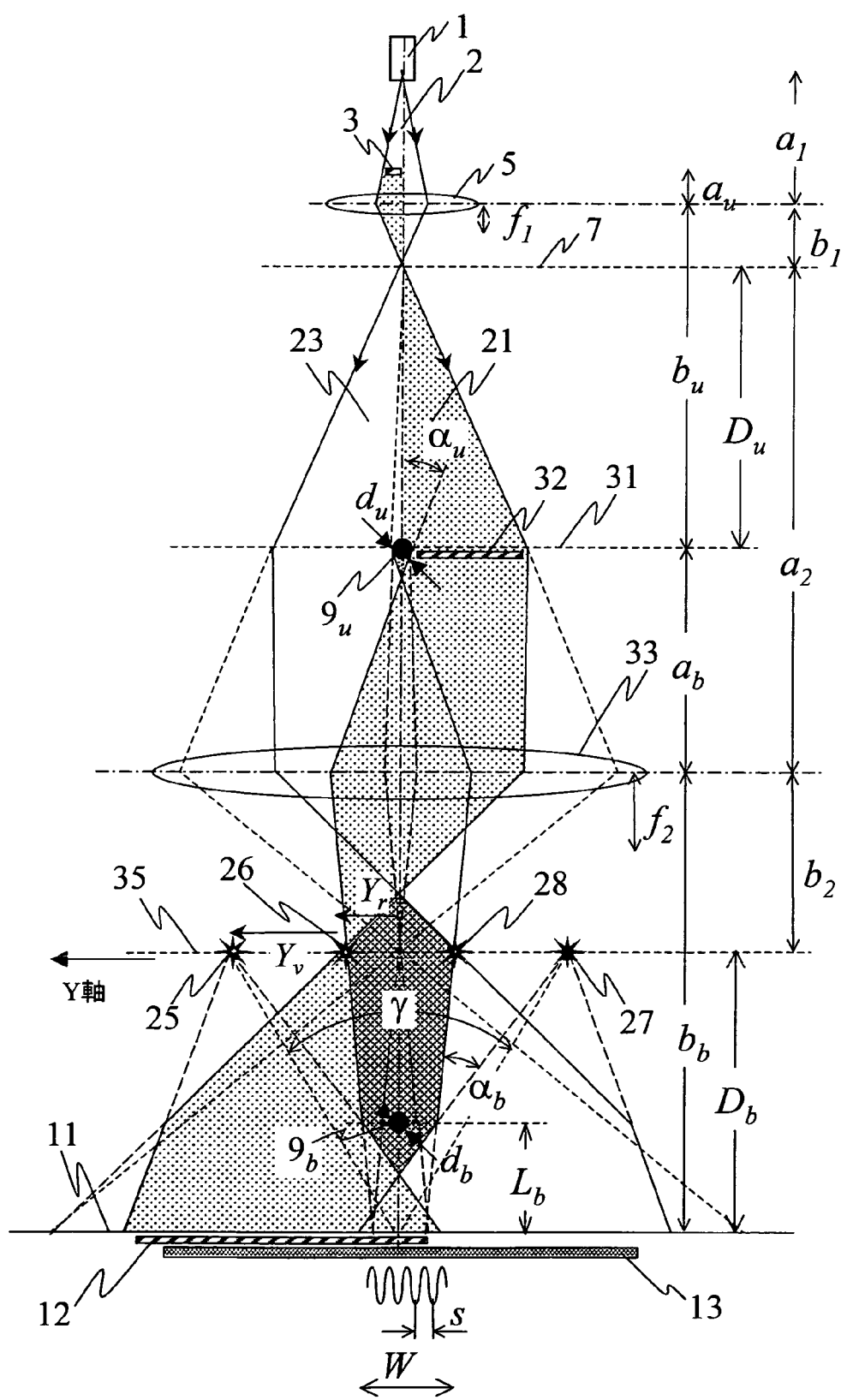
FIG. 3 is a diagram illustrating an optical system in the state where deflection is performed also by an upper stage biprism by applying a voltage also to an upper biprism electrode $9_u$ of the upper stage biprism in the electron interferometer shown in FIG. 2.

With reference to the optical system illustrated in FIG. 3, Operations are described in the case where voltage is applied to the upper biprism electrode $9_u$ as well as to the lower biprism electrode $9_b$ so as to deflect electron beams passing thereby. More specifically, in the operations, the fringe spacing s produced by electron beams deflected by the upper biprism is finely controlled so that the electron beams travel toward the optical axis 2. The reference numerals shown in FIG. 3 donate the same or equivalent parts shown in FIG. 2. Reference numerals 26 and 28 denote the positions of real electron source images of the object wave 21 and the reference wave 23, each deflected by the electron biprism electrode $9_u$. Reference numeral $Y_r$ denotes a split distance between the electron source image produced by the electrode $9_u$ of the upper electron biprism and the optical axis. Reference numeral $Y_v$ denotes a split distance between the virtual electron source image produced by the lower electron biprism electrode $9_b$ and the optical axis.

Since the observation plane 11 is the in-focus plane of the electrode of the upper electron biprism $9_u$, the deflection due to the upper electron biprism does not affect formation of an image thereon, resulting in no overlap of wavefronts. The electron beams, however, are actually deflected, and thereby split real source images 26, 28 are generated. These images are essentially the same as the split virtual source images 25, 27. The split distances Yv, Yr on the Y-axis produced by each biprism are given by the equations (10) and (11).

$$Y_v = \alpha_b(b_b - b_2 - L_b) = \alpha_b(D_b - L_b) \qquad (10)$$

$$Y_r = \frac{b_2}{a_2} \cdot \alpha_u(b_u - b_1) = M_2 \cdot a_u \cdot D_u \qquad (11)$$

herein, $M_2$ denotes a magnification ratio of the optical system in the lower stage relative to the source $b_2/a_2$.

In an electron optical system where paraxial approximation is applied, a total split distance of the source is obtained by the linear addition, and thereby an interference fringe when both biprisms act at the same time is expressed as in the equations (12), (13).

$$s_{Obj} = \frac{a_b}{b_b} \cdot \frac{a_u}{b_u} \cdot \frac{a_2(b_b - b_2)\lambda}{2\{\alpha_b a_2(b_b - b_2 - L_b) + a_u b_2(b_u - b_1)\}} \qquad (12)$$

$$= \frac{1}{M_b} \cdot \frac{1}{M_u} \cdot \frac{a_2 D_b \lambda}{2\{a_b a_2(D_b - L_b) + a_u b_2 D_u\}}$$

-continued $$W_{Obj} = \frac{a_b}{b_b} \cdot \frac{a_u}{b_u} \cdot 2\alpha_b L_b - \frac{a_u}{b_u} d_u \qquad (13)$$

$$= \frac{1}{M_b} \cdot \frac{1}{M_u} \cdot 2\alpha_b L_b - \frac{1}{M_u} d_u$$

to the equations described above, equations (7) and (13) are the same. This means that the interference width W does not depend upon the deflection angle $\alpha_u$ produced by the upper biprism. This enables each of the fringe spacing and the interference width W to be controlled independently. In other words, with the procedure of (1) Specifying the interference width W using the lower biprism, and
(2) Adjusting the fringe spacing s using the upper biprism, the fringe spacing s and the interference width W can be controlled independently. In addition, when the electrode $9_b$ of the lower biprism is placed at the position of a source image $(D_b - L_b = 0)$, the fringe spacing s does not depend upon the deflection angle $\alpha_b$. That is, under this optical condition, the fringe spacing s and the interference width W can be controlled fully independently.

However, it is generally understood that, with a conventional electron microscope, obtaining the relation of $D_b - L_b = 0$ is difficult in most cases because of the limitation of focal length of a lens. Therefore, according to the optical system illustrated in FIG. 3, the procedure described above can be regarded as a practical method.

Interestingly, when an optical system is configured such that a source image is formed under the lower biprism $(D_b - L_b < 0)$ so as to make the denominator value of equation (12) negative, the proportionality relation between the fringe spacing s and the interference width W is reversed. That is, in the optical system, when the fringe spacing s becomes larger, the interference width W becomes smaller. This feature is effective for forming a hologram having wide fringe spacing. Even in this case, however, it is not possible to eliminate carrier interference fringes, that is, it is not possible to set the traveling directions of the object wave 21 and the reference wave 23 to the same direction.

EXAMPLE OF CONTROL 3

Figure 4:
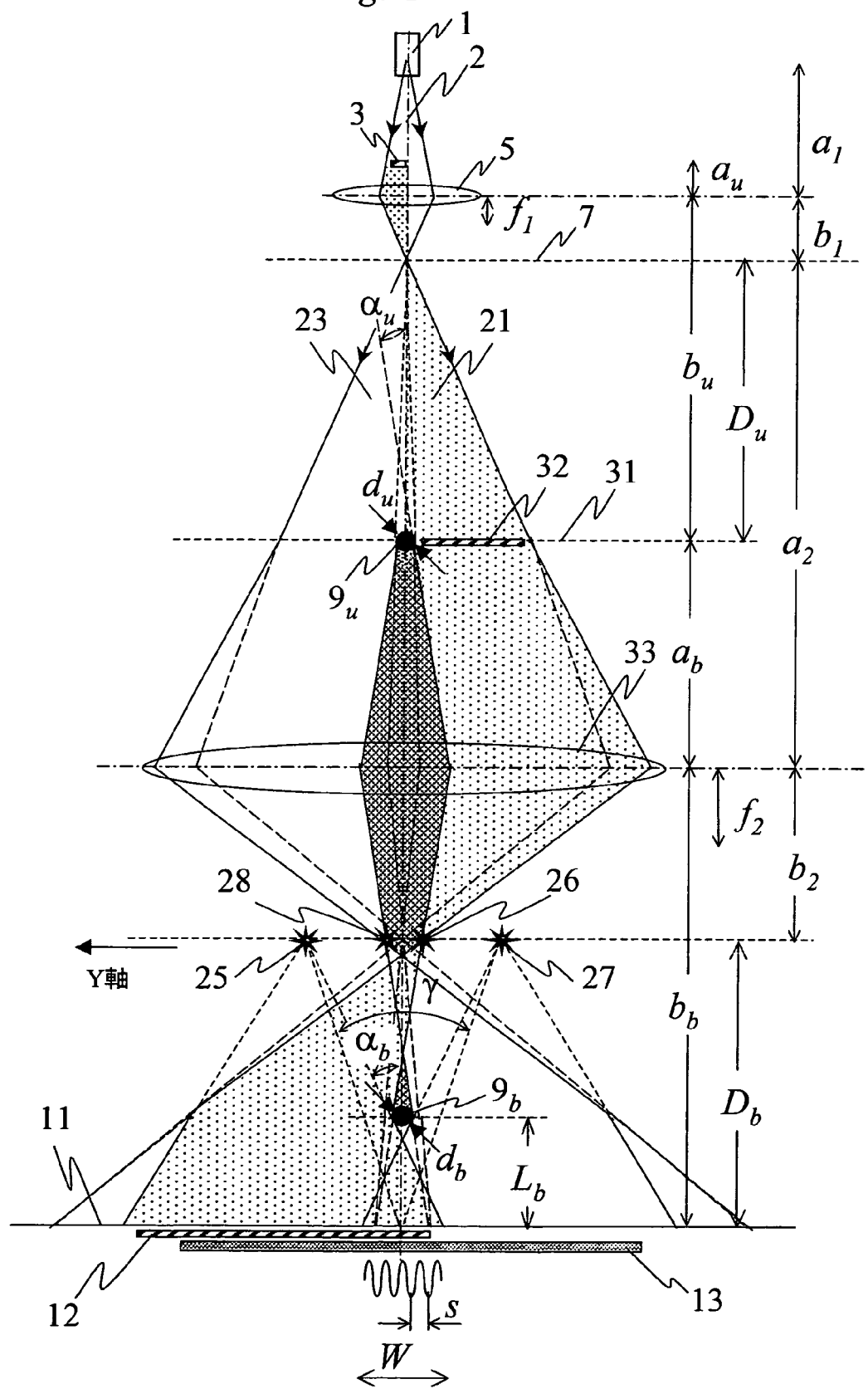
FIG. 4 is a diagram illustrating an optical system for widening fringe spacing.

FIG. 4 is a diagram illustrating an optical system for widening a fring spacing s, inversely to that in FIG. 3. In FIG. 4, the same reference numerals are used for the same or equivalent components as those shown in FIG. 3. As described with reference to FIG. 3, it is easy to reduce the fringe spacing s by deflecting an electron beam toward the optical axis 2 by means of the upper stage biprism. In contrast, to widen the fringe spacing s by deflecting an electron beam away from the optical axis 2 by means of the upper stage biprism, the presence of the electrode $9_b$ of the lower stage biprism causes some restrictions on the operation. The condition is expressed by the equation (14):

$$a_u \geq \frac{a_2}{b_2} \frac{1}{D_u} \frac{\left\{\frac{b_b}{a_b} d_u(D_b - L_b) - d_b D_b\right\}}{2L_b} \qquad (14)$$

$$= \frac{\{M_b d_u(D_b - L_b) - d_b D_b\}}{2M_2 d_u L_b}$$

It is desirable that the fring spacing s be sufficiently widened and the so-called interference micrograph be formed only with an electron beam. Since the object wave 21 and the reference wave 23 have basically to propagate in the same direction in the same optical system, however, the requirement cannot substantially be satisfied with a phase-splitting type interferometer in an electron microscope. Also in the present invention, it is easy to reduce the fringe spacing s as shown in FIG. 3, but when the fringe spacing s is to be widen as shown in FIG. 4, the Fresnel diffraction wave is generated by the electrode $9_b$ of the lower stage biprism. In Example 3 of control described above, generation of the Fresnel diffraction wave cannot be eliminated when the fringe spacing s is to be largely widened, and therefore the countermeasures as employed in the conventional technology are required.

EXAMPLE OF CONTROL 4

A reverse phase hologram is described below.

Figure 5:
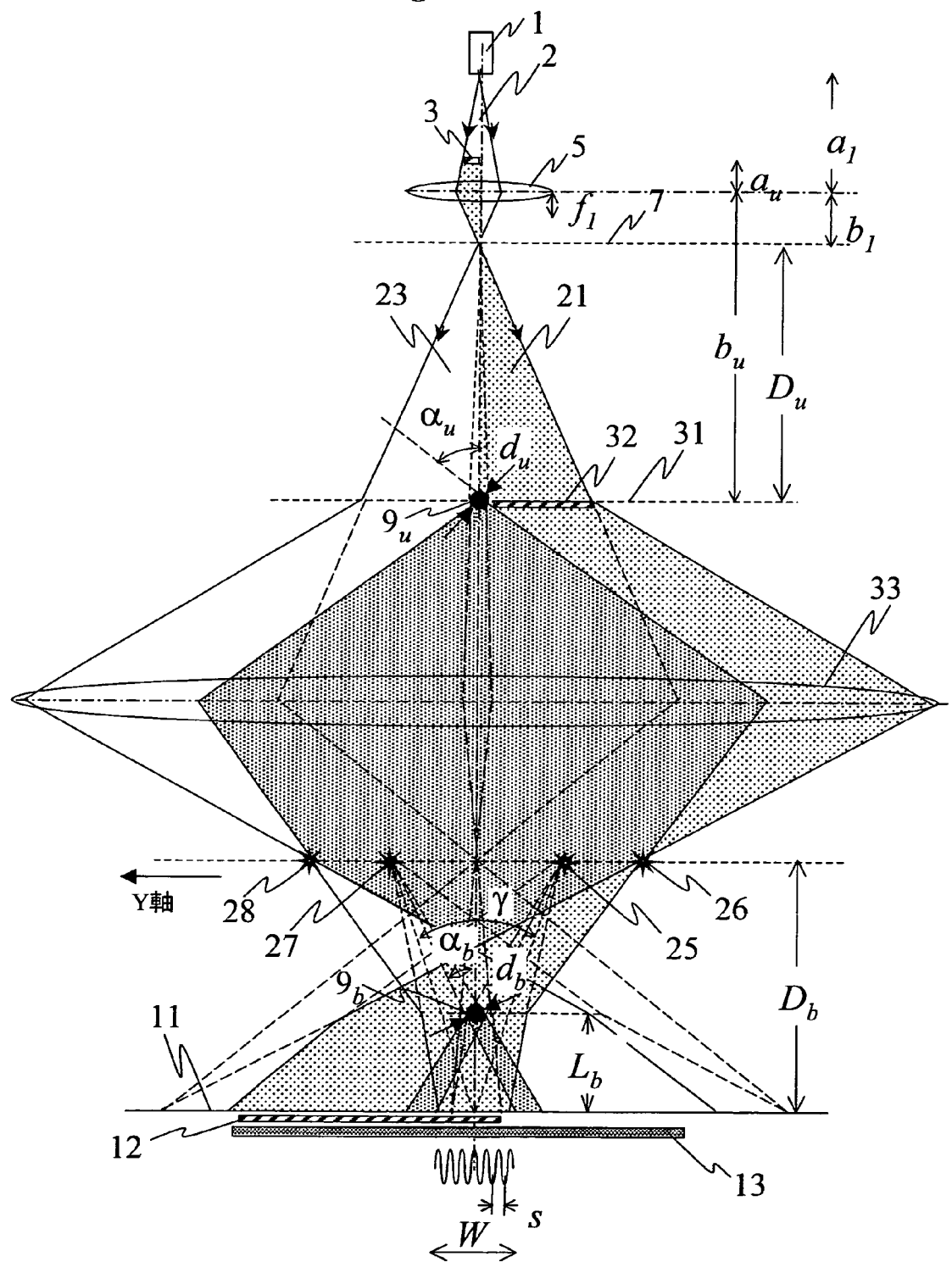
FIG. 5 is a diagram illustrating the same optical system as that shown in FIG. 4, in which conditions are set so that an electron beam is largely deflected by the upper stage biprism away from the optical axis and a wavefront desired to be focused passes under an electrode of the lower stage electron biprism.

In the optical system according to the present invention, there are two cases of angles at which the object wave 21 and the reference wave 23 are superposed on each other as shown in FIG. 3 and FIG. 4 respectively. FIG. 5 illustrates the same optical system as that shown in FIG. 4, but shows a case in which conditions are set so that a wavefront to be focused passes under the electrode $9_b$ of the lower stage biprism by largely deflecting an electron beam away from the optical axis with the upper stage biprism, in other words, when images 25, 27 of virtual electron sources relative to the optical axis 2 are symmetrically reversed as compared to those shown in FIGS. 3 and 4. In FIG. 5, the same reference numerals are assigned to components identical or equivalent to those shown in FIGS. 3 and 4.

In the state described above, interference fringes are generated by making the lower stage biprism act reversely. In this step, by successfully selecting the operating conditions, a hologram can be generated, and in the hologram generated under the conditions, an angle at which the object wave 21 and the reference wave 23 are superposed on each other is reversed. In other words, it is possible to generate a hologram having an apparently reversed phase distribution. By calculating a difference between two holograms with reversed phase distributions, it is possible to obtain a high precision reconstructed image in which the phase difference is doubled. Furthermore an interference micrograph equivalent to that obtained by the Moile method and having a doubled phase difference can be obtained by executing the double-exposure method using the two holograms (phase difference-amplified double-exposure method).

Result of Experiments

First, a method for eliminating the generation of Fresnel Fringe is described.

Figure 6A:
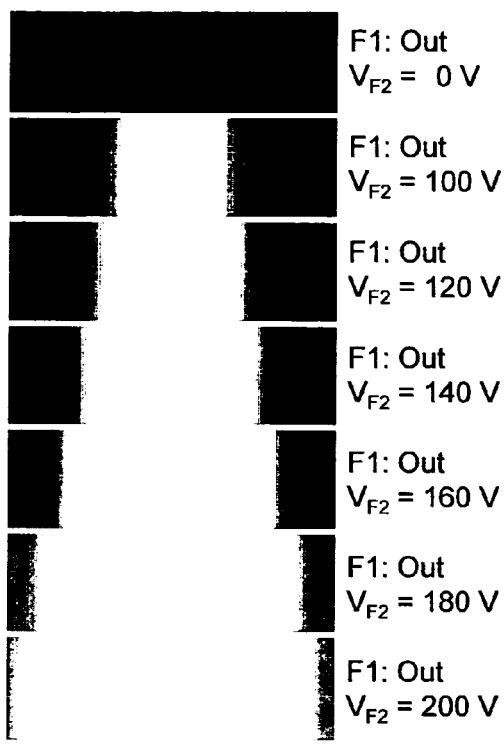
FIG. 6A illustrates formation of interference fringes with a conventional type of interferometer.
Figure 6B:
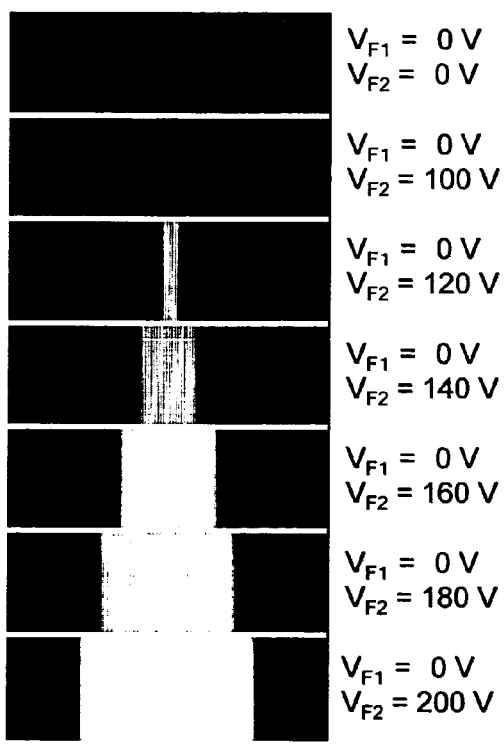
FIG. 6B illustrates formation of interference fringes eliminating generation of Fresnel fringes in the present invention.
Figure 6C:
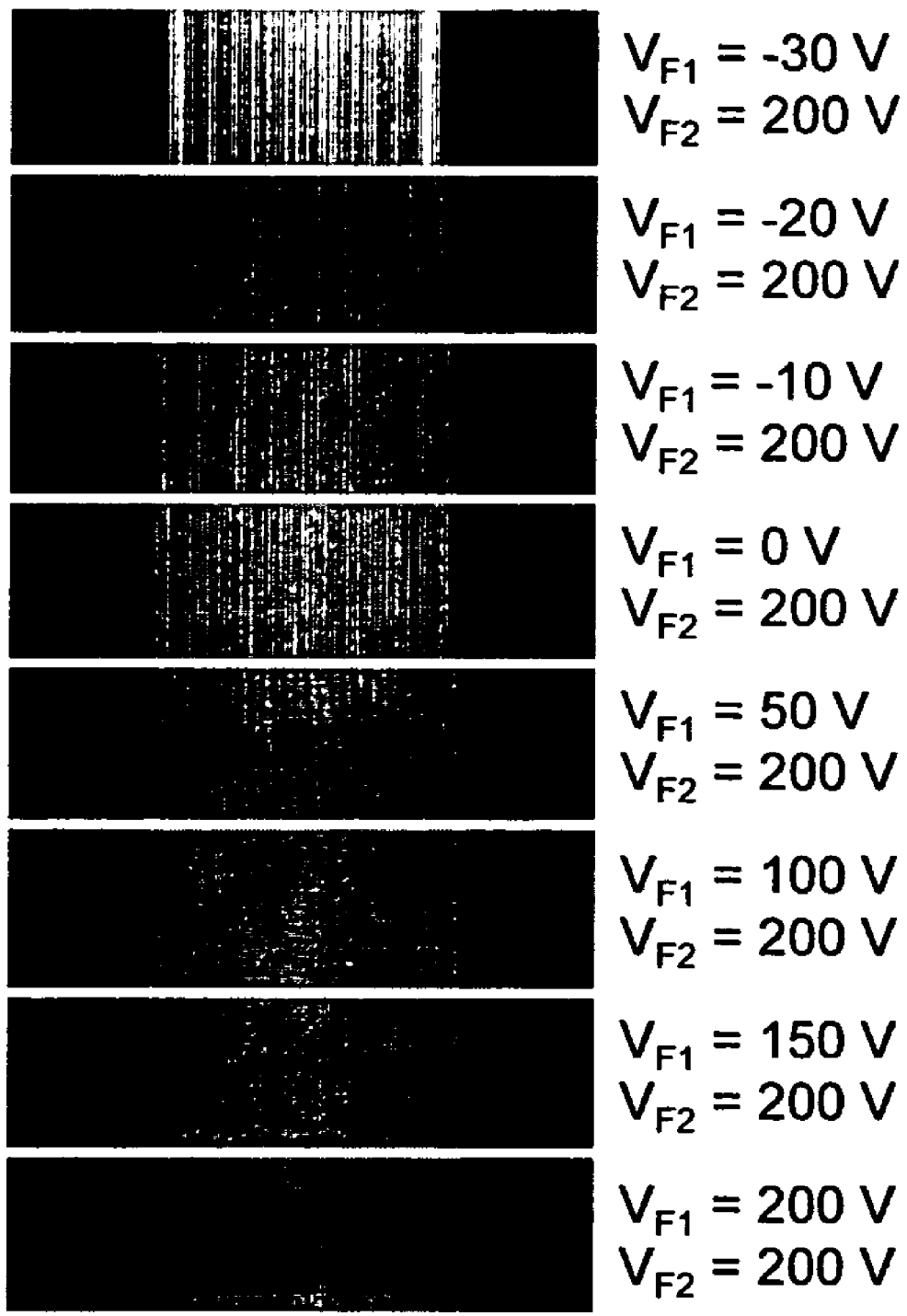
FIG. 6C illustrates formation of interference fringes by changing fringe spacing s without changing the interference width W in the present invention.

FIG. 6A illustrates interference fringes formed with a conventional interferometer. FIG. 6B illustrates interference fringes, having the same fringe spacing s as that in FIG. 6A, formed by changing the interference width W while eliminating the generation of the Fresnel fringe. FIG. 6C illustrates interference fringes formed by changing the fringe spacing s but without changing the interference width W according to the present invention. A specimen 3 is not shown in any of FIGS. 6A to 6C. Images on the left-hand side of the figure show the inference fringes arranged in sequence under different conditions, and conditions of forming the interference fringes for each image are listed on the right-hand side of the image. In FIG. 6A, a comment "F1:OUT" means that the upper biprism is removed from the optical axis. In each of the figures, symbols $V_{F1}$ and $V_{F2}$ denote voltages applied to electrodes of the upper and lower electron biprism, $9_u$ and $9_b$, respectively. That is, in a structure of the conventional interferometer, the upper biprism is removed from the optical axis as shown in FIG. 1A. The diameters $d_u$ and $d_b$ of the electron biprism electrodes $9_u$ and $9_b$ used in the experiments were 1.6 μm and 0.8 μm, respectively.

A black portion at a center of the top image in FIG. 6A is an image of lower electron beam biprism electrode $9_b$. As the voltage applied to the lower electron biprism electrode $9_b$ increases, the fringe spacing s and the interference width W change together. Under any of the conditions, Fresnel fringes caused by the lower electron biprism electrode $9_b$ are observed in the vicinity of both ends of the interference fringes.

FIG. 6B, on the other hand, illustrates an example in which both upper and lower, or two stages of, electron biprisms are placed therein, but only a voltage applied to the lower electron biprism electrode $9_b$ thereof is controlled. A black portion at a center of the top image in FIG. 6B is an image of the upper electron biprism electrode $9_u$. A black portion at a center of the second image from the top is a shrunk image of the upper electron biprism electrode $9_u$ deflected by the lower electron biprism electrode $9_b$. Interference fringes in the images lower than the second image from the top have the same fringe spacing s (as that in FIG. 6A) determined by the voltage applied to the upper electron beam biprism electrode $V_{F1}=0$ but each has different interference width W determined by the voltage applied to the lower electron biprism electrode $9_b$.

As seen from the comparison between the interference fringes in FIG. 6A and that in FIG. 6B, in FIG. 6B, no Fresnel interference fringes are substantially observed in the vicinity of both ends of the interference fringes in FIG. 6A. Instead, the interference fringes that are only necessary for measurement with an interferometer are observed. In addition, while the interference width W in FIG. 6B is smaller, it is possible to widen the interference width by making the diameter of the upper electron biprism electrode $9_u$ smaller.

Next, a description is made of how the fringe spacing s and the interference width W can be controlled independently.

FIG. 6C illustrates the results in which only the fringe spacing s is changed and the interference width W remaining unchanged by controlling the voltage applied to the upper electron biprism electrode $9_u$. In FIG. 6C, the voltage applied to the lower electron biprism electrode $9b$ is fixed at 200 V, and only the voltage applied to the upper electron biprism electrode $9_u$ is changed from −30 V to 200 V. Since the interference fringes in the fourth image from the top in FIG. 6C are the same as those of the bottom image in FIG. 6B ($V_{F1}=0V$, $V_{F2}=200V$), the interference fringes are observed by the configuration in FIG. 2. Since the interference fringes in the top image down to the third image from the top in FIG. 6C are observed when the $V_{F1}$ is a negative voltage, the interference fringes are observed by the configuration in the FIG. 4. On the other hand, since the interference fringes in the fifth image from the top to the bottom image in FIG. 6C are observed when both $V_{F1}$ and $V_{F2}$ are positive voltages, the interference fringes are observed by the configuration in the FIG. 3.

The fringe spacing s of the interference fringes in the bottom image ($V_{F1}=V_{F2}=200$ V) in FIG. 6C is significantly small. To provide such a level of the fringe spacing in the prior art, however, approximately 450 V of applied voltage is required and the interference width W becomes wider due to deteriorated coherence. Thus, interference fringes having sufficient contrast cannot be obtained. Even only because of this feature alone, it can be understood that the configuration in FIG. 3 is effective in providing interference fringes having a small fringe spacing s.

(Control of Interference Electron Micrographs (Holograms))

Next, a method for controlling the interference electron micrographs (holograms) is described.

Figure 7A:
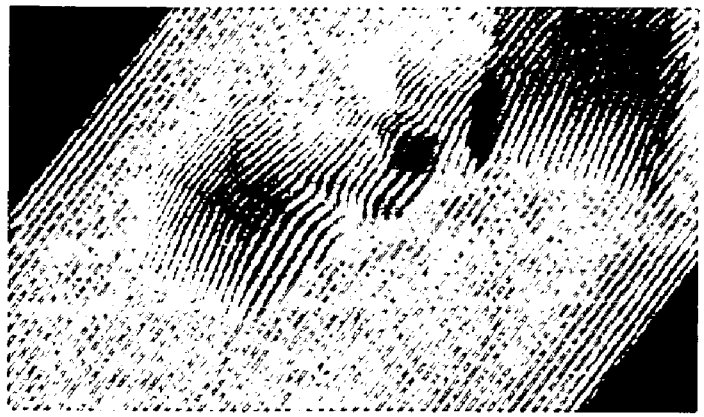
FIG. 7A illustrates a hologram obtained by controlling voltages applied to the electrodes $9_u$ and $9_b$ of the upper stage biprism and the lower stage biprism to adjust deflection angles $\alpha_u$ and $\alpha_b$.
Figure 7B:
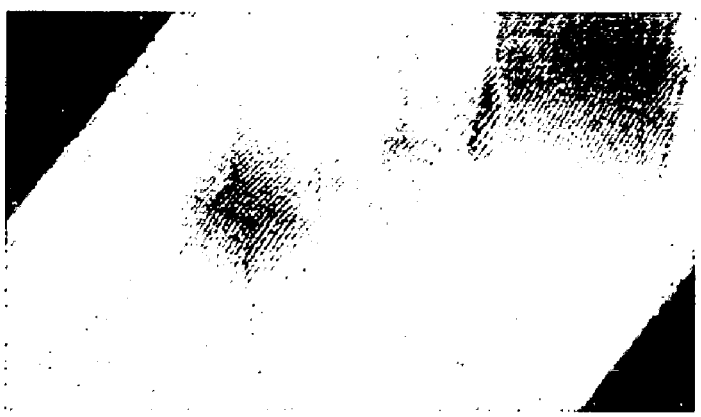
FIG. 7B illustrates a hologram obtained at a voltage value different from that shown in FIG. 7A.
Figure 7C:
FIG. 7C illustrates an image reconstructed from the hologram shown in FIG. 7B.
Figure 7D:
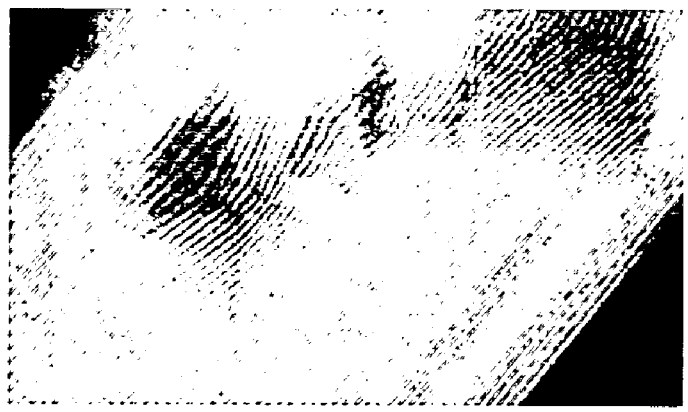
FIG. 7D illustrates a hologram at a voltage value different from that shown in FIG. 7A, in which a phase change is apparently reversed.
Figure 7E:
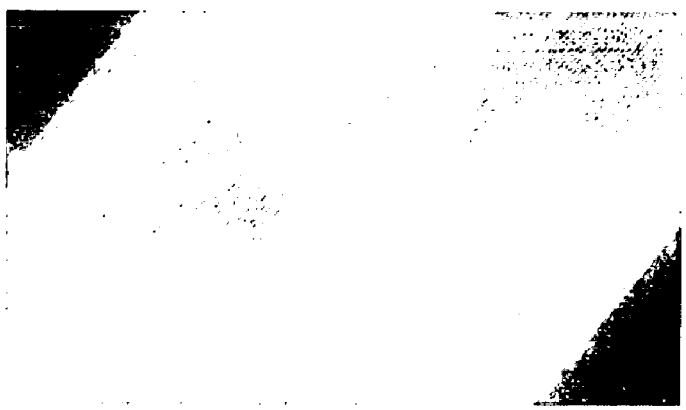
FIG. 7E illustrates a hologram obtained at a voltage value different from that shown in FIG. 7D.
Figure 7F:
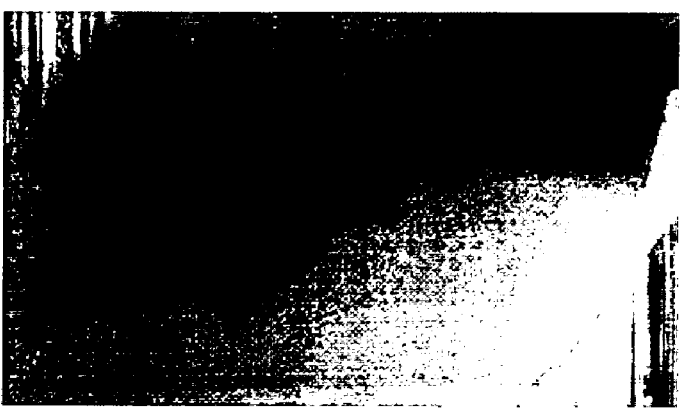
FIG. 7F illustrates an image reconstructed from the hologram shown in FIG. 7E.

Each of FIGS. 7A, 7B, 7D, and 7E illustrates a series of holograms obtained by controlling the deflection angles $\alpha_u$ and $\alpha_b$ by controlling the voltages applied to the upper and lower biprism electrodes $9_u$ and $9_b$, and FIGS. 7C and 7F illustrate reconstructed images thereof. FIG. 7A illustrates a hologram when $V_{F1}=-20V$ and $V_{F2}=190V$. FIG. 7B illustrates the hologram when $V_{F1}=50V$ and $V_{F2}=190V$. FIG. 7C illustrates a reconstructed image of the hologram in FIG. 7B. FIG. 7D illustrates a hologram when $V_{F1}=-200V$ and $V_{F2}=-190V$. FIG. 7E illustrates a hologram when $V_{F1}=-250V$ and $V_{F2}=-190V$. FIG. 7F illustrates the reconstructed image of the hologram in FIG. 7E.

In the holograms in FIGS. 7A, 7B, 7D, and 7E, each fringe spacing s of the holograms is determined by controlling the voltage $V_{F1}$ applied to the upper electron biprism $9_u$, and the interference width W is controlled so that all the holograms have substantially the same interference width by adjusting the voltage $V_{F2}$ applied to the lower electron biprism $9_b$. As is more clearly understood upon comparison between FIG. 7A and FIG. 7B, fringe lines of the interference fringes formed by the phase change caused by a specimen change in the left upper direction in FIG. 7A, but in the right blow direction in FIG. 7D. This indicates that two holograms, in which a phase-change is reversed from each other as was explained in the control example 4, are obtained. Therefore, the contrasts of their reconstructed images in FIGS. 7C and 7F are reversed from each other. In addition, when those reconstructed images are used, it becomes possible to obtain a high-accuracy reconstructed image with the phase difference thereof amplified twofold. Furthermore, when the double-exposure method is used with those two holograms, it becomes possible to obtain an interferogram immediately which is equivalent to that with the phase difference amplified twofold obtained by the Moilre method (phase-difference amplification double-exposure method).

Coherency of an electron beam mainly depends on the interference width, and therefore, as the interference width becomes wider, the coherency is more deteriorated. So, it is possible to say that those images are the results obtained by changing the carrier-spatial frequency with the coherency thereof remaining unchanged. In the conventional interferometer, when a hologram having high special resolution (fine interference fringes) is obtained, the interference width disadvantageously becomes wider, and therefore, it becomes difficult to obtain a high-quality hologram having good contrast because of the deterioration of the coherency of the electron beam. It is now understood that the present invention has overcome such disadvantages.

Proposition for Applications

In the present invention, the interference and fringe spacing of an electron beam can freely be controlled.

The following applications are possible by making use of the advantage.

(1) Measurement of Spatial Coherence (a Degree of Coherence) of an Electron Beam and Calculation of Brightness Measurement of a degree of coherence in optics is performed by measuring contrast of interference fringes as proposed, for instance, by F. Zernike: Physica 5, 50 (1938) (Refer to, for instance, B. J. Thompson and e. Wolf: J. Opt. Soc. Amer. 47, 895 (1957)). There are several examples in which the same measurement is performed by using an electron biprism also in an electron optical system (Refer to, for instance, R. Speidel and D. Kurz: Optik 49, 173 (1977)), but the measurement method is not generally employed. The reason is that, when a distance between two waves interfering with each other, namely an interference width W is changed, also a fringe spacing s is changed, and it becomes difficult to separate the recording system from the MTF (Modulation Transfer Function).

In the present invention, since a fringe spacing can be kept constant even when an interference distance between two waves is changed, separation from the MTF is easy, and a degree of coherence of an electron beam from a electron source can be measured with its spatial distribution. Furthermore, brightness of the electron source can be obtained from the value. In the conventional technology, for measurement of a degree of coherence and brightness, a specific optical system (different from that for observation of a specimen) is produced and used for evaluation. This method is based on the brightness preservation theory, which strictly holds only on the optical axis, and therefore it is effective for direct measurement and actual observation condition of a specimen with the optical system according to the present invention.

(2) Observation of Temporal Coherence

Inversely to the above description, the fact that the number of interference fringes is changed with the spatial coherence kept constant is to observe the temporal coherence intact. Experiments for observation of temporal coherence are little performed in the field of electron microscopes.

(3) Measurement for MTF of a Recording Medium

As described in (2) above, also it is possible to change a fringe spacing with a degree of coherence kept constant. Therefore, MTF and resolution of a recording medium can be measured by changing a special frequency (fringe spacing) recorded in the medium without being affected by other factors such as a change in the degree of coherence or conditions relating to lenses in the optical system.

(4) Preparation of a High-carrier Spatial Frequency Hologram

In the present invention, with the configuration as shown in FIG. 3, it is possible to obtain high density interference fringes as shown in the lowermost stage in FIG. 6C by producing a large deflection angle, which cannot be realized by a single biprism. In other words, because two biprisms are used in the present invention, restrictions such as the performance of withstanding voltage can be alleviated, and 10,000 or more interference fringes can be recorded for producing a hologram. By using a fine emulsion film as a recording medium, extremely high density interference fringes can be recorded.

(5) Production of Quantum Wire and Quantum Dot

With electron interference fringes, it is possible to simultaneously draw a number of fine parallel wires not using an electron beam lithography machine. However, it is difficult to homogeneously draw fine wires because of the Fresnel fringes generated by a biprism. With the present invention, generation of Fresnel fringes can be eliminated, and therefore fine wires can be drawn at a homogeneous dose rate. In this method, spacing between the wires and the number of the wires can freely be changed as described above. Furthermore regularly arranged quantum dots can easily be obtained by drawing the wires from the two axial directions X and Y. In addition, by controlling the two directions for drawing, it is possible to produce quantum dots with quadruple, sextuple or more symmetry.

The applications described above can easily be carried out. In addition, the present invention is effective in an experiment in which a number of interference fringes with small fringe spacing such as a high resolution holography.

Application to an Electron Interferometer Having Three or More Biprisms

Figure 8:
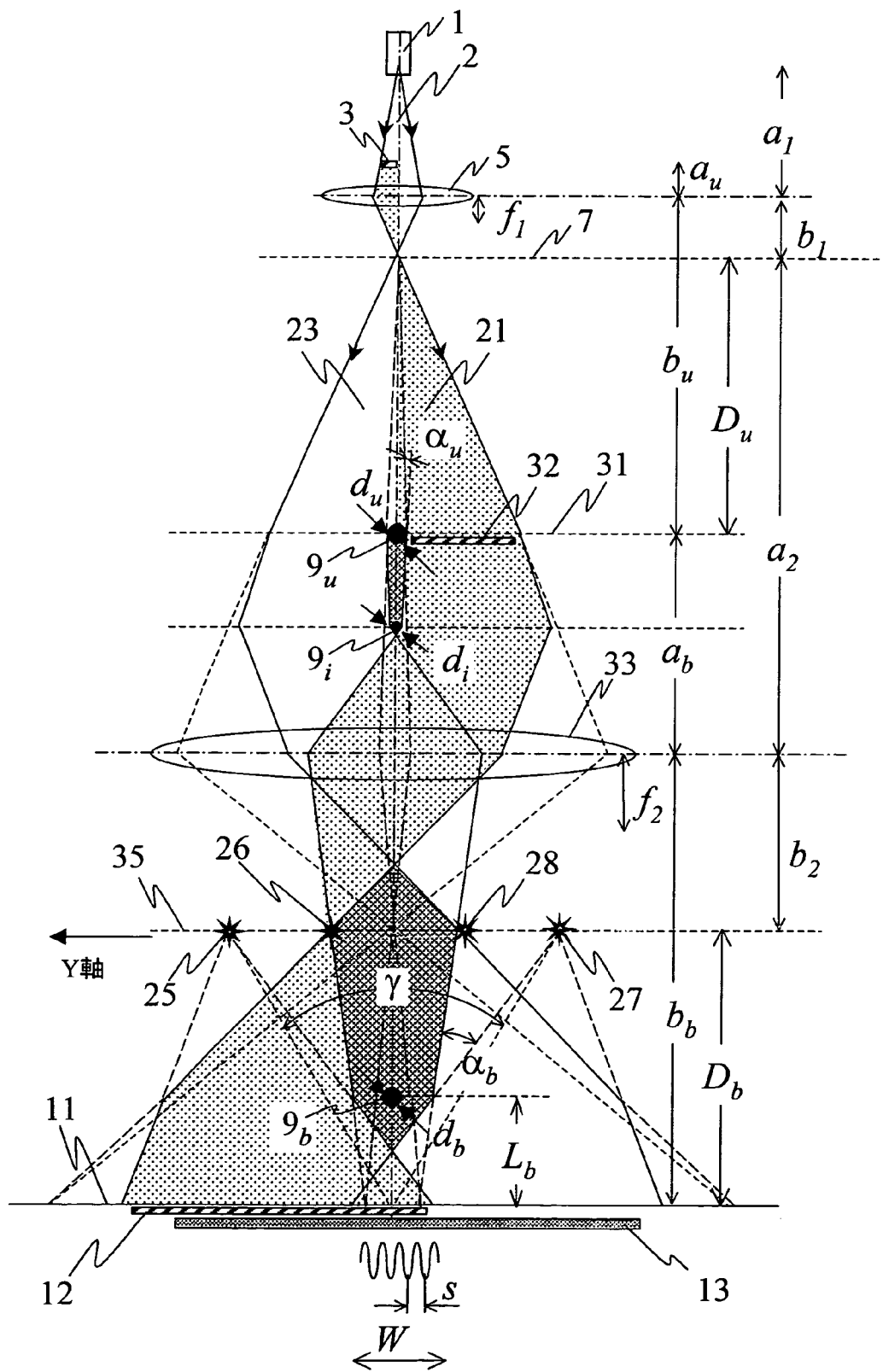
FIG. 8 is a diagram illustrating an optical system for an electron interferometer in which an intermediate biprism $9_i$ is provided in addition to the upper stage biprism $9_u$ shown in FIG. 3.

FIG. 8 is a diagram illustrating an optical system for an electron interferometer having an intermediate biprism $9_i$ in addition to the upper stage biprism $9_u$ in the configuration shown in FIG. 3. In addition to deflection by the upper stage biprism $9_u$, also deflection can be performed by the intermediate biprism $9_i$. Because of the feature described above, when about the same degree of deflection is required, voltage endurance of each biprism may be lower, and when each biprism is used up to the maximum voltage endurance, larger deflection can be realized, whereby the fringe spacing can be smaller.

Application described above can also be performed on a lower stage biprism, and a degree of freedom in control over an interference width W can be made larger. Furthermore biprism electrodes can be increased in association with the use of magnifying/demagnifying lenses. Because of the feature, any number of biprisms may be used in an optical system within an allowable range of the mechanical space.

Application to an Optical Interferometer for a Laser Beam or the Like

Figure 9:
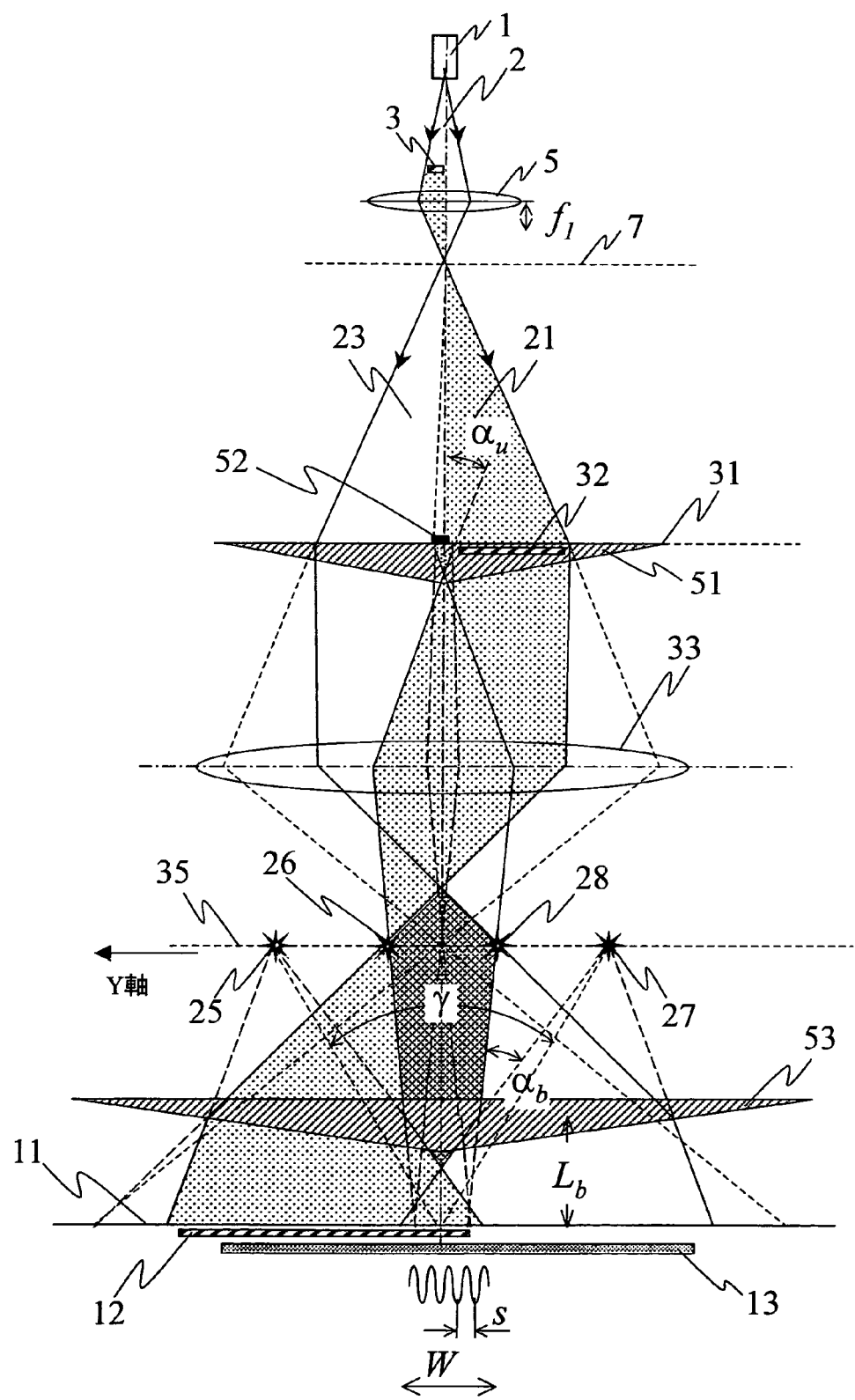
FIG. 9 is a diagram illustrating an optical system for an optical interferometer for a laser or the like in which an optical biprism is arranged at the position of the electron biprism shown in FIG. 3.

The present invention can easily be applied to an optical interferometer for a laser beam or the like. This application is possible, because it is required only to arrange an optical biprism at a position of the electron biprism. FIG. 9 is a diagram illustrating an optical system for an optical interferometer for a laser beam or the like constructed based on the concept as described above and corresponding to that shown in FIG. 3. The same reference numerals are assigned to the components identical or equivalent to those shown in FIG. 3. To describe the configuration simply, the electron biprisms are replaced with optical biprisms 51, 53, and a beam stopper 52 for shuttering light is provided at a central position of the optical biprism 51.

As easily understood by referring to FIG. 9, generally it is not possible in an optical biprism to change the deflection angle by controlling a voltage unlike in an electron biprism. Therefore it is necessary to exchange each biprism according to target fringe spacing s as well as to an interference width W, so that users are required to perform complicated operations in use. However, it is possible to overcome this problem, for instance, in the following way. A container shaped like an optical prism is made, and, for instance, gas is filled in the container such as to be variable in pressure, namely density. Thus, the same effect as that provided by a electron biprism can be provided by changing a refraction factor of the optical biprism to adjust the deflection angle or by controlling reflection angles by two mirrors used in stead of biprisms (refer to, for instance, K. Harada, K. Ogai and R. Shimizu: Technology Reports of The Osaka University 39, 117 (1989)).

Application of Three Stage Biprisms

FIGS. 10A to 10D are diagrams illustrating some variants of more general electron microscopes modified from optical systems for holography microscopes each having an upper stage biprism, a third intermediate biprism, and a lower stage biprism as shown in FIG. 8. In these figures, the same reference numerals are assigned to components having the same or equivalent functions as those shown in FIG. 8. In the figures, only a representative trajectory of an electron beam from a real electron source and trajectories of electron beams at a tip and a root of a specimen are shown. In the figures, reference numeral 61 denotes an electron source, 63 a first condenser lens, and 65 a second condenser lens. These components form the first electron source 1 described in the example above. As understood from these figures, the electron source 1 described in the example is not a true electron source, but a crossover (a image of an electron source) obtained from a real electron source 61 by plural condenser lenses. The objective lens 5, a first intermediate lens 67, a second intermediate lens 69, a third intermediate lens 71 and a projection lens 73 are arrayed along the direction from the electron source 1 to the observation plane 11.

Figure 10A:
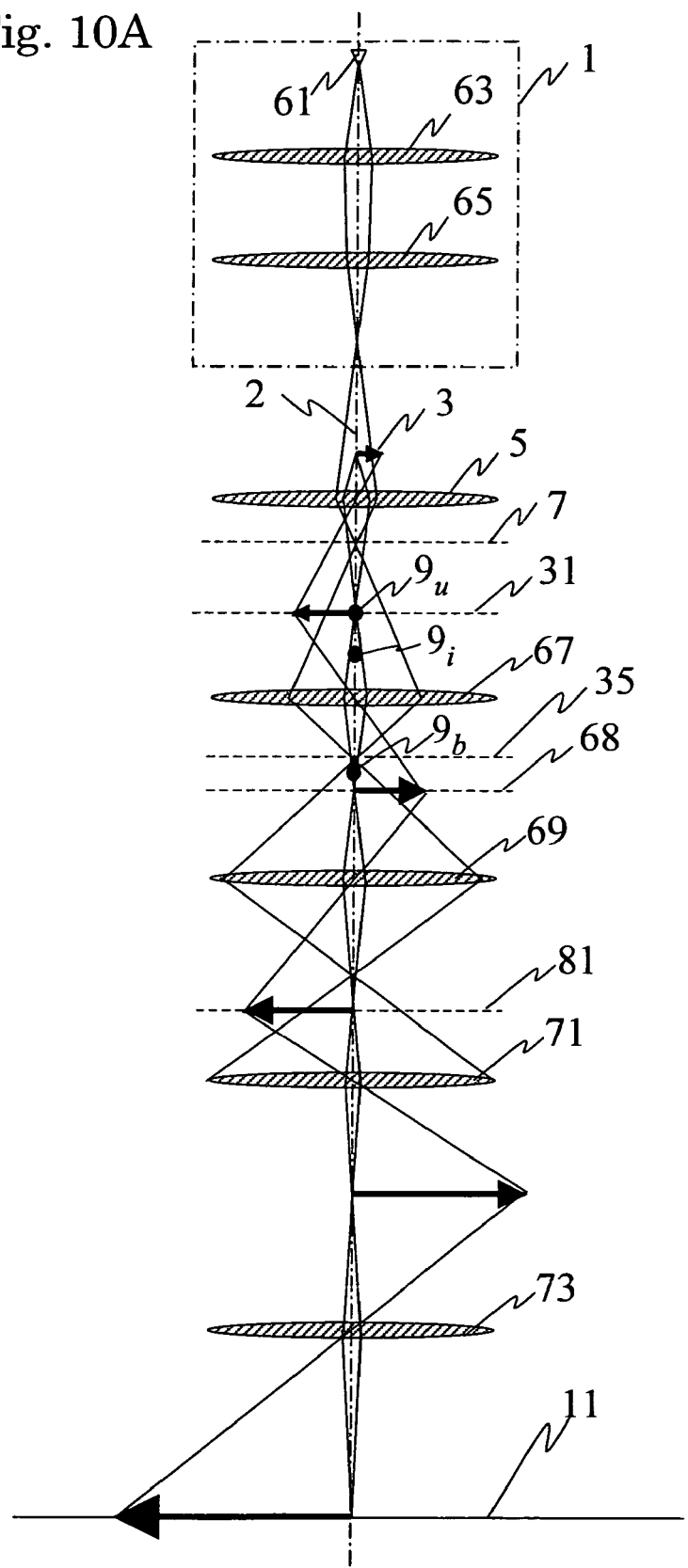
FIG. 10A is a diagram illustrating an optical system for a holography microscope having an electrode $9_u$ of the upper stage biprism, an electrode $9_i$ of the intermediate biprism, an electrode $9_b$ of the lower stage biprism, and an electrode $9_i$ of a third intermediate biprism provided above a first intermediate lens.

FIG. 10A illustrates a case in which an intermediate biprism is used as an aid for the upper stage biprism like in the case shown in FIG. 8, and the intermediate biprism electrode $9_i$ is provided above the first intermediate lens 67. The lower biprism electrode $9_b$ is provided under the second image plane of the electron source 35 and above the second image plane (11 in FIG. 8) of a specimen 68. A specimen image is projected onto a third image plane of the specimen 81 formed by the second intermediate lens 69 in the enlarged state, and is further enlarged by the third intermediate lens 71 and the projection lens 73, and the finally enlarged image is obtained on the observation plane. With the configuration shown in FIG. 10A, either a voltage applied to the upper stage biprism electrode $9_u$ or a voltage applied to the intermediate biprism electrode $9_i$ may be changed to change the fringe spacing s. Therefore, voltages applied to the upper stage biprism electrode $9_u$ and to the intermediate biprism electrode $9_i$ may be made smaller, which is advantageous for withstand voltage.

Figure 10B:
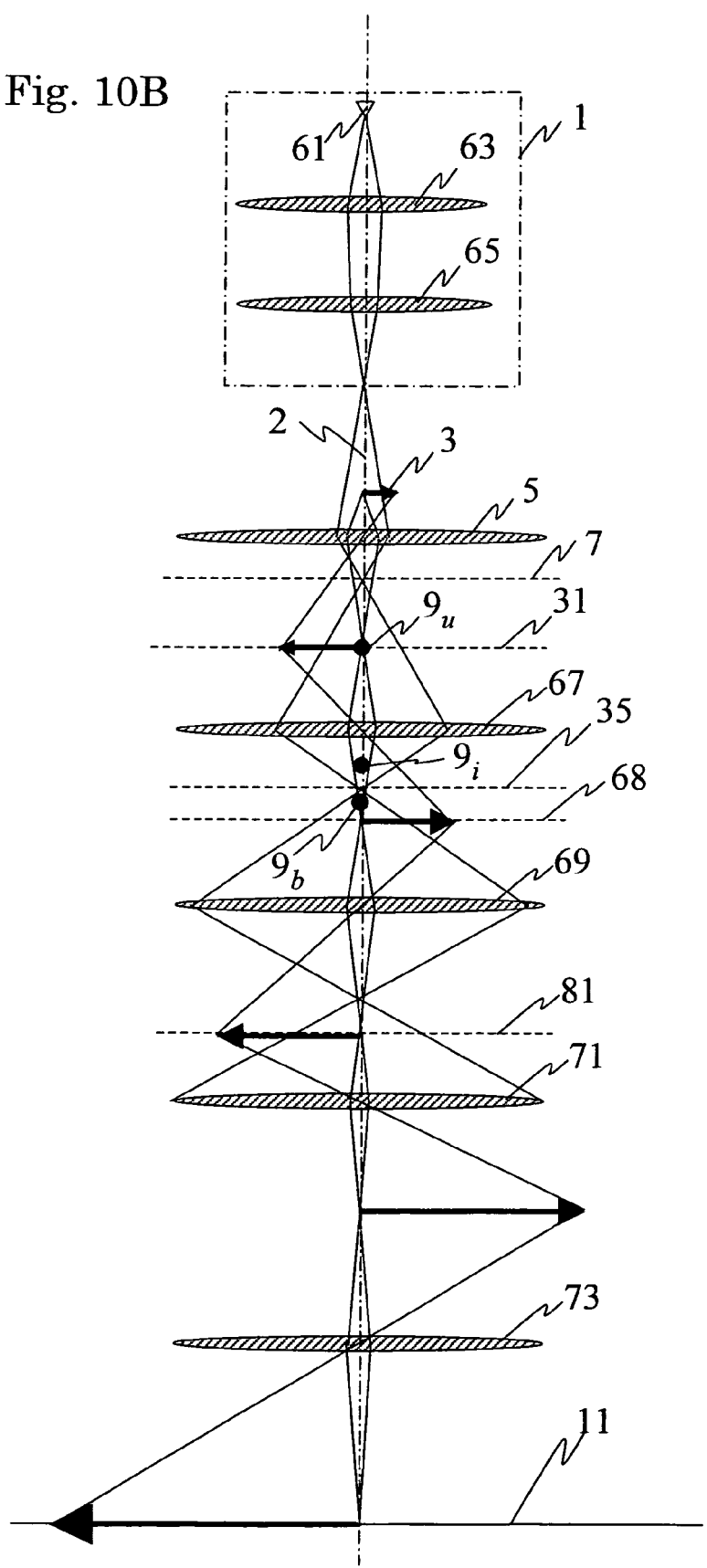
FIG. 10B is a diagram illustrating an optical system for a holography microscope having the electrode $9_u$ of the upper stage biprism, the electrode $9_i$ of the intermediate biprism, the electrode $9_b$ of the lower stage biprism, and the electrode $9_i$ of a third intermediate biprism provided below the first intermediate lens.

FIG. 10B illustrates a case in which an intermediate biprism is used as an aid for the upper stage biprism like in FIG. 10A, and the configuration is the same as that shown in FIG. 10A except that the intermediate biprism electrode $9_i$ is removed from above to under the first intermediate lens 67. Also in this case, the magnitude of plus or minus voltage required for controlling fringe spacing s and an interference width W changes according to a position of the intermediate biprism electrode $9_i$.

Figure 10C:
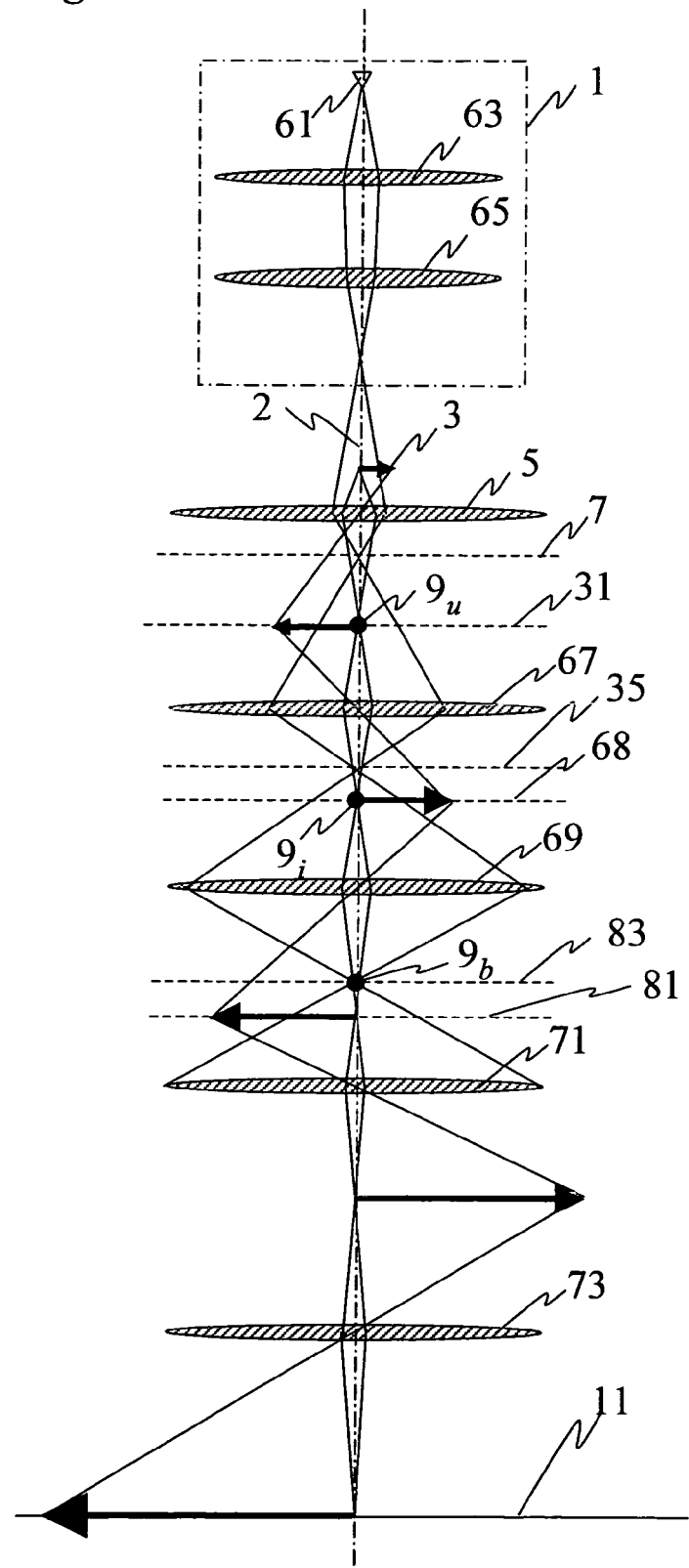
FIG. 10C is a diagram illustrating an optical system for a holography microscope having the electrode $9_u$ of the upper stage biprism, the electrode $9_i$ of the intermediate biprism, the electrode $9_b$ of the lower stage biprism, and the electrode $9_i$ of a third intermediate biprism provided on a second image plane below the first intermediate lens.

FIG. 10C is the same as FIG. 10A, and FIG. 10B in that the intermediate biprism is used as an aid for the upper stage biprism, but in this configuration, completely independent control over the fringe spacing s and the interference width W are possible like in the case of $(D_b-L_b=0)$ described with reference to FIG. 3. The intermediate biprism electrode $9_i$ is provided on the second image plane 68 of a specimen under the first intermediate lens 67. The lower stage biprism $9_b$ is provided on the third image plane 83 of an electron source under the second intermediate lens 69. In this configuration, either one of voltages applied to the upper stage biprism electrode $9_u$ and the intermediate biprism electrode $9_i$ may be changed to change the fringe spacing s like in the case shown in FIG. 10. Therefore, voltages applied to the upper stage biprism electrode $9_u$ and the intermediate biprism electrode $9_i$ may be made smaller, which is advantageous from the view point of withstand voltage. In addition, the fringe spacing s can independently be controlled by controlling voltages applied to the upper biprism electrode $9_u$ and to the intermediate biprism electrode $9_i$, while the interference width W can independently be controlled by controlling the voltage applied to the lower stage biprism electrode $9_b$. Thus controls over the two factors of the fringe spacing s and the interference width W can be performed without being affected with each other.

Figure 10D:
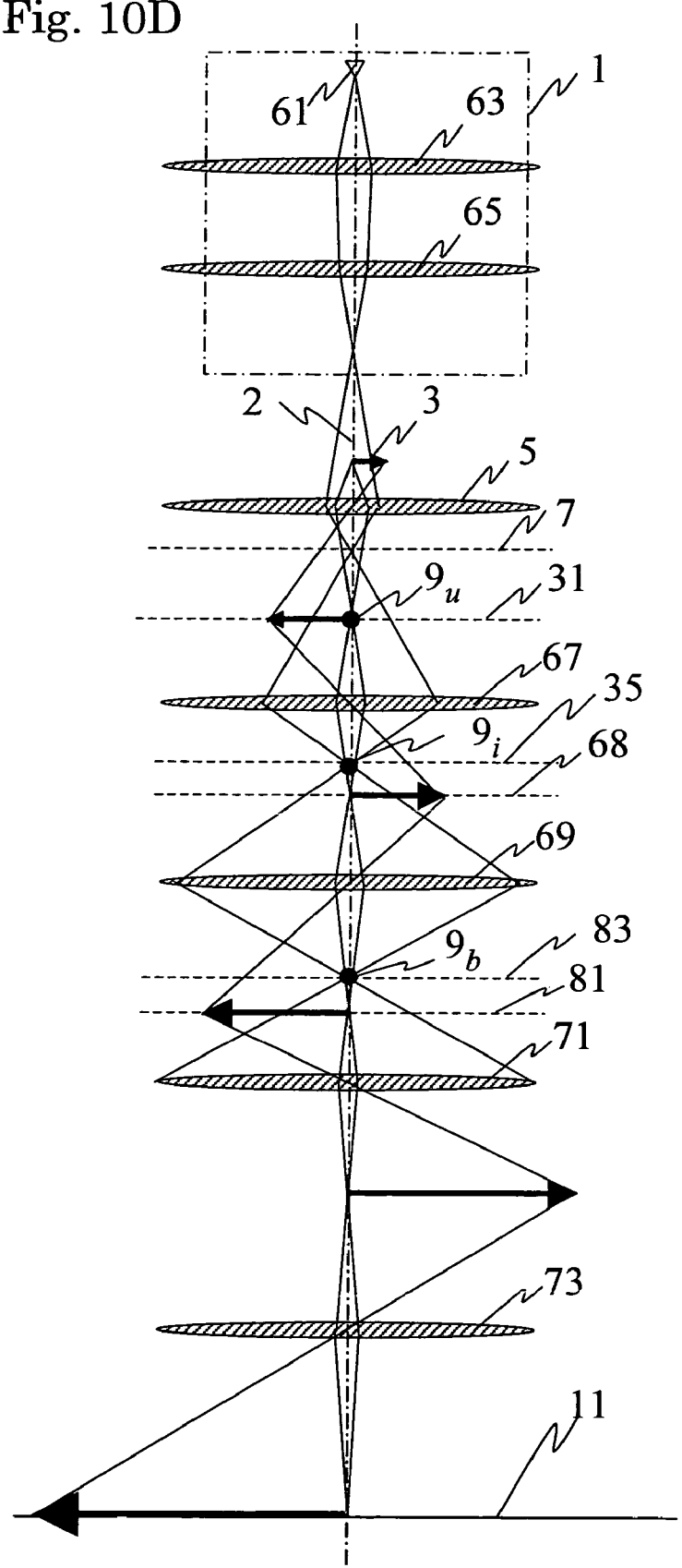
FIG. 10D is a diagram illustrating an optical system for a holography microscope having the electrode $9_u$ of the upper stage biprism, the electrode $9_i$ of the intermediate biprism, the electrode $9_b$ of the lower stage biprism, and the electrode $9_i$ of a third intermediate biprism provided on a second image plane of a electron source below the first intermediate lens.

The case shown in FIG. 10D is the same as that shown in FIG. 10C in that completely independent control over the fringe spacing s and the interference width W is possible, but in the configuration shown in FIG. 10D, the intermediate biprism electrode $9_i$ is provided on the second image plane of an electron source 35 under the first intermediate lens 67, and the intermediate biprism is used as an auxiliary for the lower stage biprism.

Figure 11:
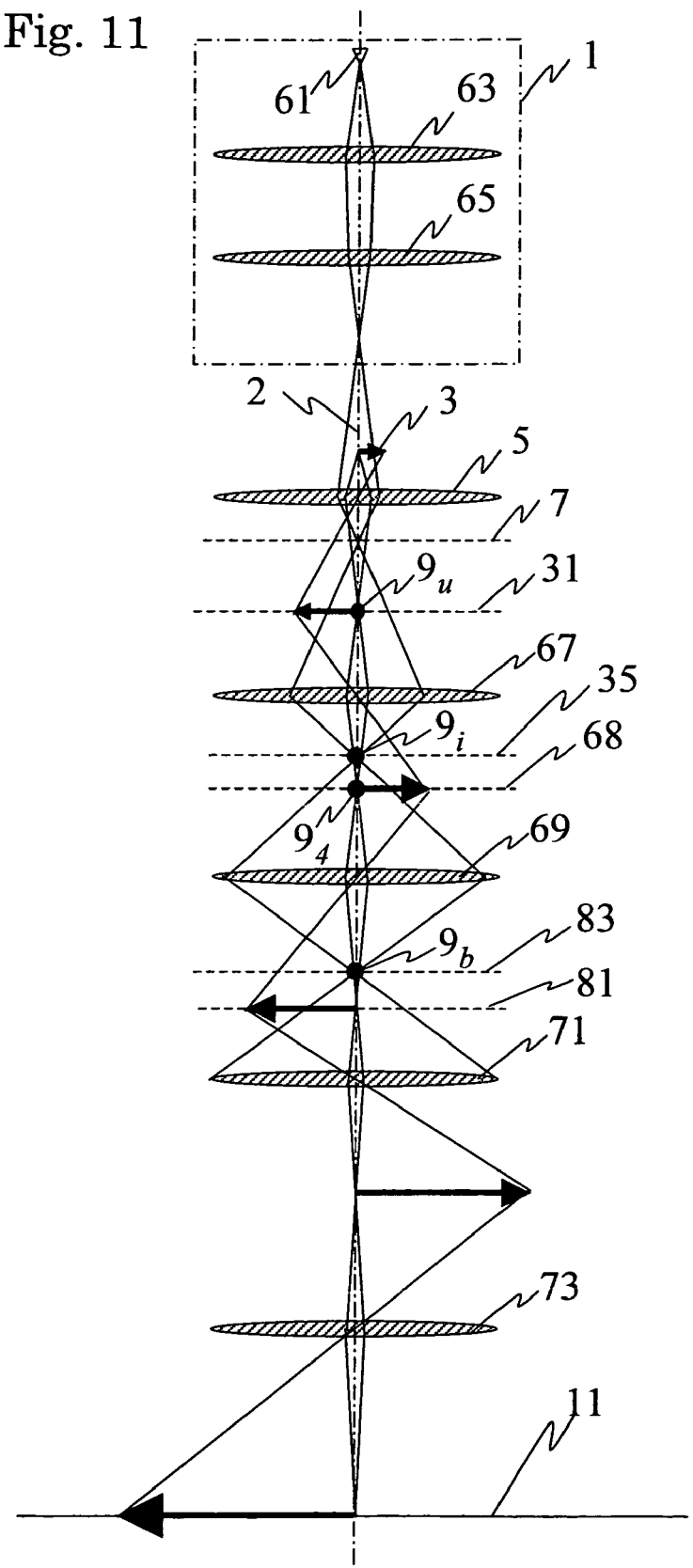
FIG. 11 is a diagram illustrating an example of an optical system for a holography microscope in which the third intermediate biprism is used as an auxiliary unit for the upper stage biprism and furthermore a fourth biprism is used as an auxiliary unit for the lower stage biprism.

FIG. 11 is a diagram illustrating an optical system for a holography microscope in which the third intermediate biprism is used as an auxiliary for the lower stage biprism and also a fourth biprism is used as an auxiliary for the upper stage biprism. In this configuration, the upper stage electron biprism $9_u$ is provided on the first image plane of a specimen 31, while the intermediate biprism electrode $9_i$ is provided on the second image plane of a electron source 35 under the first intermediate lens 67. The lower stage biprism electrode $9_b$ is provided on the third image plane 83 of the electron source. In addition, a fourth biprism electrode $9_4$ is provided on the second image plane 68 of the specimen. In this configuration, voltage control for changing the fringe spacing s can be performed by adjusting voltages applied to the upper stage biprism electrode $9_u$ and to the intermediate biprism electrode $9_i$ respectively, and also voltage control for changing the interference width W can be performed by adjusting voltages applied to the lower stage biprism electrode $9_b$ and to the fourth biprism electrode $9_4$ respectively, and therefore voltages to the respective biprism electrodes can be made smaller, which is advantageous from the view point of withstand voltage.

The optical systems described above are exemplary, and the present invention can be carried out with various forms as understood by referring to FIGS. 10A to 10D and 11.

INDUSTRIAL APPLICABILITY

The present invention provides an electron interferometer and an optical interferometer capable of controlling fringe spacing s and an interference width W independently, in a phase-splitting type optical interferometer using electron biprisms or a phase-splitting type optical interferometer using general optical biprisms, thus, substantially improving convenience for users.

What is claimed is:

1. An interferometer comprising:
   a electron source for an electron beam;
   a condenser lens system for condensing an electron beam emitted from the electron source to a specimen;
   a specimen holder for holding a specimen irradiated by the electron beam;
   a lens system for focusing an image of the specimen;
   a device for observing or recording the specimen;
   an upper stage biprism comprising one or more electrodes provided on a plane perpendicular to an optical axis and at a position of an image plane of the specimen, the image plane formed on the downstream side of the position of the specimen in the traveling direction of the electron beam on the optical axis; and
   a lower stage biprism comprising one or more electrodes provided on the downstream side of the position of the upper stage biprism in the traveling direction of the electron beam via one of the lens or the plural lenses of the lens system and on a plane parallel to the upper biprism;
   wherein each of the two biprisms is capable of moving and rotating the one or more electrodes independently, and applying a voltage independently to deflect an electron beam in one electro-optic plane including the optical axis.

2. The interferometer according to claim 1,
   wherein the lower stage biprism is provided on the downstream side of a lens or lenses positioned on the downstream side of a first image plane of the specimen on the optical axis of the electron beam, and is provided on the downstream side of an image of the electron source formed with the lens or lenses.

3. The interferometer according to claim 2,
   wherein the lower stage biprism is provided on the downstream side of a lens or lenses positioned on the downstream side of a first image plane of the specimen on the optical axis of the electron beam, and is provided on an image plane of the electron source formed with the lens or lenses.

4. The interferometer according to claim 1,
   wherein the lower stage biprism is provided on the downstream side of a lens or lenses positioned on the downstream side of a first image plane of the specimen on the optical axis of the electron beam, and provided between one of the lenses and an image of the electron source formed with one of the lenses.

5. The interferometer according to claim 2,
   wherein electron beams are deflected toward the optical axis of the electron beam by the upper stage biprism and are further deflected toward the optical axis of the electron beam by the lower stage biprism.

6. The interferometer according to claim 2,
   wherein electron beams are deflected toward the optical axis of the electron beam by the upper stage biprism, and are deflected by the lower stage biprism away from the optical axis of the electron beam.

7. The interferometer according to claim 2,
   wherein electron beams are deflected by the upper stage biprism away from the optical axis of the electron beam and are deflected by the lower stage biprism toward the optical axis of the electron beam.

8. The interferometer according to claim 2,
   wherein electron beams are deflected by the upper stage biprism away from the optical axis of the electron beam and are further deflected by the lower biprism further away from the optical axis of the electron beam.

9. The interferometer according to claim 1 further comprising:
   a third biprism positioned between the upper stage biprism and the lens provided on the downstream side of the specimen image plane firstly formed on the optical axis of the electron beam, the third biprism being positioned on a third plane parallel to planes on which the upper stage biprism and the lower stage biprism are placed, wherein the third biprism is capable of applying a voltage independently from the upper stage biprism and the lower stage biprism, moving the upper stage biprism and the lower stage biprism, and rotating the electrodes of the biprisms to thereby deflect electron beams in the same electro-optic plane including the optical axis to or away from which the two biprisms deflect the electron beams.

10. The interferometer according to claim 1 further comprising:
    a third biprism positioned between a lens placed on the downstream side of the spacemen image plane firstly formed on the optical axis of the electron beam and an image plane of the electron source formed by the lens or between an image plane of the electron source and a specimen image plane on the optical axis secondly formed by the lens, the third biprism being positioned on a third plane parallel to planes on which the upper stage biprism and the lower stage biprism are placed, wherein the third biprism is capable of applying a voltage independently from the upper stage biprism and the lower stage biprism, moving the upper stage biprism and the lower stage biprism, and rotating electrodes of the biprisms to thereby deflect electron beams in the same electro-optic plane including the optical axis to or away from which the two biprisms deflect the electron beams.

11. The interferometer according to claim 1 further comprising:
a third prism positioned on the second image plane of the electron source on the optical axis formed by a lens provided on the downstream side of the specimen image plane first formed on the optical axis of the electron beam, the third biprism being positioned on a third plane parallel to planes on which the upper stage biprism and the lower stage biprism are placed, wherein the third biprism is capable of applying a voltage independently from the upper stage biprism and the lower stage biprism, moving the upper stage biprism and the lower stage biprism, and rotating electrodes of the biprisms to thereby deflect electron beams in the same electro-optic plane including an optical axis to or away from which the two biprisms deflect the electron beams.

12. The interferometer according to claim 1 further comprising:
a third biprism positioned on the second image plane of the specimen on the optical axis, the third biprism being positioned on a third plane parallel to planes on which the upper stage biprism and the lower stage biprism are placed, wherein the third biprism is capable of applying a voltage independently from the upper stage biprism and the lower stage biprism, moving the upper stage biprism and the lower stage biprism, and rotating electrodes of the biprisms to thereby deflect electron beams in the same electro-optic plane including an optical axis to or away from which the two biprisms deflect the electron beams.

13. The interferometer according to claim 1 further comprising:
the upper stage biprism;
the lower stage biprism; and
a third biprism is positioned on the second image plane of the electron source on the optical axis, the third biprism being positioned on a third plane parallel to planes on which the upper stage biprism and the lower stage biprism are placed, wherein the third biprism is capable of capable of applying a voltage independently from the upper stage biprism and the lower stage biprism, moving the upper stage biprism and the lower stage biprism, and rotating electrodes of the biprisms to thereby deflect electron beams in the same electro-optic plane including an optical axis to or away from which the two biprisms deflect the electron beams; and
a fourth biprism positioned on a second image plane of the specimen on the optical axis, the fourth biprism being positioned on a forth plane parallel to each of the three planes, wherein the fourth biprism is cable of applying a voltage independently from the upper stage biprism, the lower stage biprism, or from the third biprism and rotating electrodes of the biprisms to thereby deflect electron beams in the same electro-optic plane including an optical axis to or away from which the three biprisms deflect the electron beams.

14. The interferometer according to claim 1 comprising the upper stage biprism and the lower stage biprism, or the third or fourth biprism,
wherein a plurality of parallel straight lines is capable of being drawn in batch on an material placed on an observation/recording plane of the optical system, or on a plane optically equivalent to the observation/recording plane.

15. The interferometer according to claim 1,
wherein, among the upper stage biprism and the lower stage biprism, the third biprism, and the fourth biprism, all of the biprisms to be used rotate about an optical axis of an electron beam on a plane perpendicular to the optical axis, while keeping the deflection plane of the electron beam constant, and an electron beam is capable of irradiating multiple times to a material placed on an observation/recording plane of the optical system or on a plane optically equivalent to the observation/recording plane.

16. The interferometer according to claim 14, wherein the light source is a source emitting a light beam, and each of the biprisms is an optical biprism.

* * * * *